United States Patent
Boyce et al.

(10) Patent No.: US 10,562,812 B2
(45) Date of Patent: Feb. 18, 2020

(54) COATED ARTICLE HAVING METAMATERIAL-INCLUSIVE LAYER, COATING HAVING METAMATERIAL-INCLUSIVE LAYER, AND/OR METHOD OF MAKING THE SAME

(71) Applicant: Guardian Glass, LLC, Auburn Hills, MI (US)

(72) Inventors: Brent Boyce, Novi, MI (US); Patricia Tucker, Lambertville, MI (US); Shashi Shah, Auburn Hills, MI (US); Cesar Clavero, Auburn Hills, MI (US)

(73) Assignee: GUARDIAN GLASS, LLC, Auburn Hills, MI (US)

( * ) Notice: Subject to any disclaimer, the term of this patent is extended or adjusted under 35 U.S.C. 154(b) by 32 days.

(21) Appl. No.: 16/006,223

(22) Filed: Jun. 12, 2018

(65) Prior Publication Data

US 2019/0375677 A1 Dec. 12, 2019

(51) Int. Cl.
*B32B 3/02* (2006.01)
*C03C 17/36* (2006.01)
(Continued)

(52) U.S. Cl.
CPC ........ *C03C 17/366* (2013.01); *C03C 17/3636* (2013.01); *C03C 17/3639* (2013.01);
(Continued)

(58) Field of Classification Search
CPC .............. C03C 17/366; C03C 17/3636; C03C 17/3639; C03C 17/3642; C03C 17/3644;
(Continued)

(56) References Cited

U.S. PATENT DOCUMENTS

| 4,193,236 A | 3/1980 | Mazzoni et al. |
| 4,379,040 A | 4/1983 | Gillery |

(Continued)

FOREIGN PATENT DOCUMENTS

| CA | 2 895 325 | 6/2014 |
| CN | 2013 58 298 | 12/2009 |

(Continued)

OTHER PUBLICATIONS

U.S. Appl. No. 16/006,256, filed Jun. 12, 2018, Boyce et al.
(Continued)

*Primary Examiner* — Elizabeth E Mulvaney

(57) ABSTRACT

Certain example embodiments of this invention relate to coated articles having a metamaterial-inclusive layer, coatings having a metamaterial-inclusive layer, and/or methods of making the same. Metamaterial-inclusive coatings may be used, for example, in low-emissivity applications, providing for more true color rendering, low angular color dependence, and/or high light-to-solar gain. The metamaterial material may be a noble metal or other material, and the layer may be made to self-assemble by virtue of surface tensions associated with the noble metal or other material, and the material selected for use as a matrix. An Ag-based metamaterial layer may be provided below a plurality (e.g., 2, 3, or more) continuous and uninterrupted layers comprising Ag in certain example embodiments. In certain example embodiments, barrier layers comprising TiZrOx may be provided between adjacent layers comprising Ag, as a lower-most layer in a low-E coating, and/or as an upper-most layer in a low-E coating.

49 Claims, 18 Drawing Sheets

(51) Int. Cl.
*C23C 14/08* (2006.01)
*C23C 14/18* (2006.01)
*C09D 1/00* (2006.01)
*C09D 5/32* (2006.01)
*C23C 14/34* (2006.01)

(52) U.S. Cl.
CPC ...... *C03C 17/3642* (2013.01); *C03C 17/3644* (2013.01); *C03C 17/3681* (2013.01); *C09D 1/00* (2013.01); *C09D 5/32* (2013.01); *C23C 14/083* (2013.01); *C23C 14/086* (2013.01); *C23C 14/185* (2013.01); *C23C 14/34* (2013.01); *C03C 2217/213* (2013.01); *C03C 2217/216* (2013.01); *C03C 2217/23* (2013.01); *C03C 2217/256* (2013.01); *C03C 2218/154* (2013.01); *C03C 2218/32* (2013.01)

(58) Field of Classification Search
CPC ........ C03C 17/3681; C09D 1/00; C09D 5/32; C32C 14/083; C32C 14/086; C32C 14/185; C32C 14/34
See application file for complete search history.

(56) References Cited

U.S. PATENT DOCUMENTS

| | | |
|---|---|---|
| 4,464,874 A | 8/1984 | Shea, Jr. et al. |
| 4,466,562 A | 8/1984 | Detorre |
| 4,671,155 A | 6/1987 | Goldinger |
| 4,746,347 A | 5/1988 | Sensi |
| 4,792,536 A | 12/1988 | Pecoraro et al. |
| 4,806,220 A | 2/1989 | Finley |
| 4,861,669 A | 8/1989 | Gillery |
| 4,898,789 A | 2/1990 | Finley |
| 4,898,790 A | 2/1990 | Finley |
| 4,900,633 A | 2/1990 | Gillery |
| 4,920,006 A | 4/1990 | Gillery |
| 4,938,857 A | 7/1990 | Gillery |
| 5,030,593 A | 7/1991 | Heithoff |
| 5,030,594 A | 7/1991 | Heithoff |
| 5,059,295 A | 10/1991 | Finley |
| 5,088,258 A | 2/1992 | Schield et al. |
| 5,106,663 A | 4/1992 | Box |
| 5,113,473 A | 5/1992 | Yoshida et al. |
| 5,240,886 A | 8/1993 | Gulotta et al. |
| 5,328,768 A | 7/1994 | Goodwin |
| 5,385,872 A | 1/1995 | Gulotta et al. |
| 5,393,593 A | 2/1995 | Gulotta et al. |
| 5,401,569 A | 3/1995 | Kineri et al. |
| 5,418,039 A | 5/1995 | Carter |
| 5,425,861 A | 6/1995 | Hartig et al. |
| 5,492,750 A | 2/1996 | Shumaker, Jr. et al. |
| 5,521,765 A | 5/1996 | Wolfe |
| 5,584,902 A | 12/1996 | Hartig et al. |
| 5,817,410 A | 10/1998 | Tsujimura et al. |
| 5,852,303 A | 12/1998 | Cuomo |
| 5,858,471 A | 1/1999 | Ray |
| 5,916,401 A | 6/1999 | Gannon |
| 5,999,315 A | 12/1999 | Fukano et al. |
| 6,045,896 A | 4/2000 | Boire |
| 6,104,530 A | 8/2000 | Okamura |
| 6,353,501 B1 | 3/2002 | Woodruff |
| 6,395,398 B1 | 5/2002 | Nakashima et al. |
| 6,398,925 B1 | 6/2002 | Arbab et al. |
| 6,965,191 B2 | 11/2005 | Koike |
| 7,659,002 B2 | 2/2010 | Coster |
| 7,901,781 B2 | 3/2011 | Maschwitz |
| 8,865,325 B2 | 10/2014 | Polcyn et al. |
| 9,073,041 B2 | 7/2015 | Guo et al. |
| 9,075,253 B2 | 7/2015 | Buchanan |
| 9,076,247 B2 | 7/2015 | Matjasko et al. |
| 9,604,875 B2 | 3/2017 | Polcyn et al. |
| 9,932,267 B2 | 4/2018 | Polcyn et al. |
| 10,082,920 B2 * | 9/2018 | Den Boer ............ C03C 17/3671 |
| 10,233,531 B2 * | 3/2019 | Lu ........................... C03C 17/36 |
| 2004/0009356 A1 | 1/2004 | Medwick et al. |
| 2004/0146645 A1 | 7/2004 | Freeman et al. |
| 2005/0244977 A1 | 11/2005 | Drachev et al. |
| 2006/0083938 A1 | 4/2006 | Kim et al. |
| 2006/0147727 A1 | 7/2006 | Glenn et al. |
| 2007/0116967 A1 | 5/2007 | Medwick et al. |
| 2007/0242359 A1 | 10/2007 | Thielsch et al. |
| 2007/0281178 A1 | 12/2007 | Oh |
| 2009/0067028 A1 | 3/2009 | Kawata |
| 2010/0029058 A1 | 2/2010 | Shimomura |
| 2010/0209617 A1 | 8/2010 | Lin et al. |
| 2011/0013192 A1 | 1/2011 | Yang et al. |
| 2011/0236715 A1 | 9/2011 | Polcyn et al. |
| 2011/0261442 A1 | 10/2011 | Knoll |
| 2011/0262726 A1 | 10/2011 | Knoll |
| 2012/0207923 A1 | 8/2012 | Baumgartner |
| 2013/0258456 A1 * | 10/2013 | Hashimura ............ G02B 5/208 359/359 |
| 2015/0191393 A1 | 7/2015 | Polcyn et al. |
| 2015/0205021 A1 | 7/2015 | Howell et al. |
| 2016/0223729 A1 | 8/2016 | Medwick et al. |
| 2017/0144928 A1 * | 5/2017 | Caillet .................. E06B 3/6715 |
| 2017/0198518 A1 | 7/2017 | Caillet et al. |
| 2017/0241009 A1 | 8/2017 | Boyce et al. |
| 2017/0241012 A1 | 8/2017 | Boyce et al. |
| 2017/0341977 A1 | 11/2017 | Polcyn et al. |
| 2018/0118614 A1 | 5/2018 | Polcyn et al. |
| 2018/0148371 A1 | 5/2018 | Polcyn et al. |

FOREIGN PATENT DOCUMENTS

| | | |
|---|---|---|
| CN | 104755563 | 7/2015 |
| CN | 104755688 | 7/2015 |
| CN | 104768872 | 7/2015 |
| CN | 104769419 | 7/2015 |
| CN | 108137394 | 6/2018 |
| EP | 2 442 142 | 4/2012 |
| EP | 2 693 845 | 2/2014 |
| EP | 2 693 846 | 2/2014 |
| JP | 62-174189 | 7/1987 |
| JP | 03-294829 | 12/1991 |
| JP | 2000-192227 | 7/2000 |
| JP | 2001/353810 | 12/2001 |
| JP | 4498615 | 4/2010 |
| KR | 10-1524965 | 5/2015 |
| KR | 10-2015-0060793 | 6/2015 |
| KR | 10-2015-0064113 | 6/2015 |
| KR | 10-2015-0064126 | 6/2015 |
| RU | 2 152 911 | 7/2000 |
| WO | 9613379 | 5/1996 |
| WO | 2012/162295 | 11/2012 |
| WO | 2012/170230 | 12/2012 |
| WO | WO 2013/021197 | 2/2013 |
| WO | WO 2013/039454 | 3/2013 |
| WO | 2014/035690 | 3/2014 |
| WO | 2014/035691 | 3/2014 |
| WO | WO 2014/188237 | 11/2014 |
| WO | WO 2015/028037 | 3/2015 |
| WO | 2015069339 A3 | 7/2015 |

OTHER PUBLICATIONS

U.S. Appl. No. 16/006,292, filed Jun. 12, 2018, Boyce et al.
Kentaro Fukuda et al., "Coalescence of Magnetron-Sputtered Silver Islands Affected by Transition Metal Seeding (Ni, Cr, Nb, Zr, Mo, W, Ta)," Science Direct, Jun. 13, 2007, 7 pages.
Sylvio Schubert et al., "Improvement of Transparent Metal Top Electrodes for Organic Solar Cells by Introducing a High surface Energy Seed Layer," Advanced Energy Materials, Jan. 31, 2013, 6 pages.
Jiří Bulíř k et al., "Preparation of Nonostructured Ultrathin Silver Layer," Journal of Nanophotonics, vol. 5, Mar. 17, 2011, 11 pages.
Vesna Janicki et al., "Design and Production of Bicolour Reflecting Coatings with Au Metal Island Films," Optics Express, vol. 19, No. 25, Dec. 5, 2011, 7 pages.

(56) References Cited

OTHER PUBLICATIONS

Z. Aspanut et al. "Fabrication and Characterization of Co-Sputtering Au/SiO$_2$ Thin Films Prepared by RF Magnetron Sputtering", Nanoelectronics Conference (INEC), 2010 3$^{rd}$ International, Jan. 1, 2010, pp. 970-971.

Zhang et al., "Self-Assembly of Large-Scale and Ultrathin Silver Nanoplate Films with Tunable Plasmon Resonance Properties", ACS NANO, vol. 5, No. 11, Nov. 22, 2011, pp. 9082-9092.

Gao et al., "Recent Developments and Applications of Hybrid Surface Plasmon Resonance Interfaces in Optical Sensing", Anan Bioanal Chem (2011), vol. 399, No. 1, Oct. 20, 2010, 11 pages.

Fukuura et al., "Long Range Enhancement of Molecular Fluorescence by Closely Packed Submicro-scale AG Islands", E-Journal of Surface Science and Nanotechnogy, vol. 7, Jan. 1, 2009; pp. 653-659.

International Search Report and Written opinion for International Application No. PCT/IB2019/054858, dated Nov. 7, 2019, 11 pages.

* cited by examiner

COATED ARTICLE HAVING METAMATERIAL-INCLUSIVE LAYER, COATING HAVING METAMATERIAL-INCLUSIVE LAYER, AND/OR METHOD OF MAKING THE SAME

TECHNICAL FIELD

Certain example embodiments of this invention relate to coated articles, coatings used in connection with coated articles, and methods of making the same. More particularly, certain example embodiments of this invention relate to coated articles having a metamaterial-inclusive layer, coatings having a metamaterial-inclusive layer, and/or methods of making the same. Metamaterial-inclusive coatings may be used, for example, in low-emissivity applications, providing for more true color rendering, low angular color dependence, and/or high light-to-solar gain.

BACKGROUND AND SUMMARY

Coated articles are known in the art. Coated articles have been used, for example, in window applications such as insulating glass (IG) window units, vehicle windows, and/or the like.

In certain situations, designers of coated articles often strive for a combination of desirable visible transmission, desirable color values, high light-to-solar gain (LSG, which is equal to visible transmission ($T_{vis}$) divided by solar heat gain coefficient (SHGC)) values, low-emissivity (or low-emittance), low SHGC values, and low sheet resistance ($R_s$). High visible transmission, for example, may permit coated articles to be more desirable in certain window applications. Low-emissivity (low-E), low SHGC, high LSG, and low sheet resistance characteristics, for example, permit such coated articles to block significant amounts of IR radiation from passing through the article. For example, by reflecting IR radiation, it is possible to reduce undesirable heating of vehicle or building interiors.

When light passes through a coated article, however, the perceived color is not always "true" to the original, e.g., because the incident external light is modified by the film or substrate of the window. The color change oftentimes is angularly dependent. Indeed, in conventional coated articles that include low-E coatings, angular color oftentimes is sacrificed to obtain high LSG.

It will be appreciated that it oftentimes would be desirable to help ensure that transmitted color rendering is true, and/or to reduce the severity of or possibly even completely eliminate the tradeoff between angular coloration and LSG. Certain example embodiments address these and/or other concerns.

The field of "metamaterials" is an emerging technology area and is seen as a way to enable certain new technologies. Some efforts have been made to use such materials in a variety of applications such as, for example, in satellite, automotive, aerospace, and medical applications. Metamaterials also have started to show some promise in the area of optical control.

Unfortunately, however, the use of metamaterials in optical control coatings and the like has been plagued by losses related to undesirable surface plasmon resonances or polaritons and can lead to thermal gain. In this regard, and as is known to those skilled in the art, the resonance wavelength is the wavelength at which the metamaterial exhibits surface plasmon resonance. It is typically accompanied by a dip in transmittance and an increase of reflectivity.

Certain example embodiments have been able to overcome these problems associated with the use of metamaterials in optical control coatings. For example, certain example embodiments use a combination of a high index dielectric and a noble metal, which together create a desirable resonance. In this regard, modelling data has indicated a resonance in the near infrared (NIR) spectrum (e.g., from about 700-1400 nm) is sufficient to control angular coloration, as well as improvement in LSG. Metamaterials thus may be used in low-E coatings, and layers may be deposited using sputtering or other technologies.

It will be appreciated that the metamaterial-inclusive layers described herein include discontinuous features with individual length scales longer than individual molecules and atoms but shorter than the wavelength of light (typically in the 10-300 nm range), and having a synthetic structure that exhibits properties not usually found in natural materials. In certain example embodiments, layers comprising discontinuous deposits of sub-wavelength size metal islands are provided, with the sub-wavelength size being for example less than the shortest visible wavelength (e.g., less than about 380 nm). It will be appreciated that the properties not usually found in natural materials that pertain to certain example embodiments may include, for example, the desirable resonances and angular coloration discussed herein, creation of colored transmission to simulate a tinted substrate (e.g., consistently across a wide range of viewing angles), creation of color or visual acuity enhancing effects such as might be used with sunglasses where particular visible ranges of wavelengths are selectively absorbed, etc.

In certain example embodiments, a coated article is provided. A substrate supports a multi-layer low-emissivity (low-E) coating. The multi-layer low-E coating comprises: a plurality of sub-stacks, with each said sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and a metamaterial-inclusive layer comprising Ag embedded in a matrix of material, with the metamaterial-inclusive layer being closer to the substrate than each of the sub-stacks, and with the Ag in the metamaterial-inclusive layer being discontinuous.

In certain example embodiments, a coated article is provided. A substrate supports a multi-layer low-emissivity (low-E) coating. The multi-layer low-E coating comprises: a plurality of sub-stacks, with each said sub-stack including, in order moving away from the substrate, a barrier layer comprising TiZrOx, a lower contact layer comprising zinc oxide, a continuous and uninterrupted layer comprising Ag over and directly contacting the layer comprising zinc oxide, and an upper contact layer over and directly contacting the layer comprising Ag; and a metamaterial-inclusive layer comprising Ag embedded in a matrix of material. The Ag in the metamaterial-inclusive layer is substantially spherical or ellipsoidal and distributed throughout the matrix material.

In certain example embodiments, a coated article is provided. A substrate supports a multi-layer low-emissivity (low-E) coating. The multi-layer low-E coating comprises: at least one sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and a synthetic layer self-assembled by heat treatment, with the synthetic layer comprising discontinuous island-like formations of material embedded in a matrix, with the synthetic layer being closer to the substrate than the at least one sub-stack, and with each said island-like formation having a major distance of 10-300 nm.

In certain example embodiments, a method of making a coated article including a multi-layer low-E coating supported by a glass substrate is provided. The method comprises: forming a plurality of sub-stacks on the substrate, with each said sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and forming a metamaterial-inclusive layer comprising Ag embedded in a matrix of material, with the metamaterial-inclusive layer being closer to the substrate than each of the sub-stacks, and with the Ag in the metamaterial-inclusive layer being discontinuous.

In certain example embodiments, a method of making a coated article including a multi-layer low-E coating supported by a glass substrate is provided. The method comprises: forming a plurality of sub-stacks on the substrate, with each said sub-stack including, in order moving away from the substrate, a barrier layer comprising an oxide of Ti and/or Zr, a lower contact layer comprising zinc oxide, a continuous and uninterrupted layer comprising Ag over and directly contacting the layer comprising zinc oxide, and an upper contact layer over and directly contacting the layer comprising Ag; and causing a synthetic layer to self-assemble via heat treatment, with the synthetic layer, once self-assembled, comprising discontinuous island-like formations of material including Ag embedded in a matrix. The Ag in the synthetic layer is substantially spherical or ellipsoidal and distributed throughout the matrix.

In certain example embodiments, a method of making a coated article including a multi-layer low-E coating supported by a glass substrate is provided. The method comprises: forming at least one sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and forming a metamaterial-inclusive layer comprising Ag embedded in a matrix of material, with the metamaterial-inclusive layer being closer to the substrate than the at least one sub-stack, and with the Ag in the metamaterial-inclusive layer being discontinuous.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION

Figure 1:
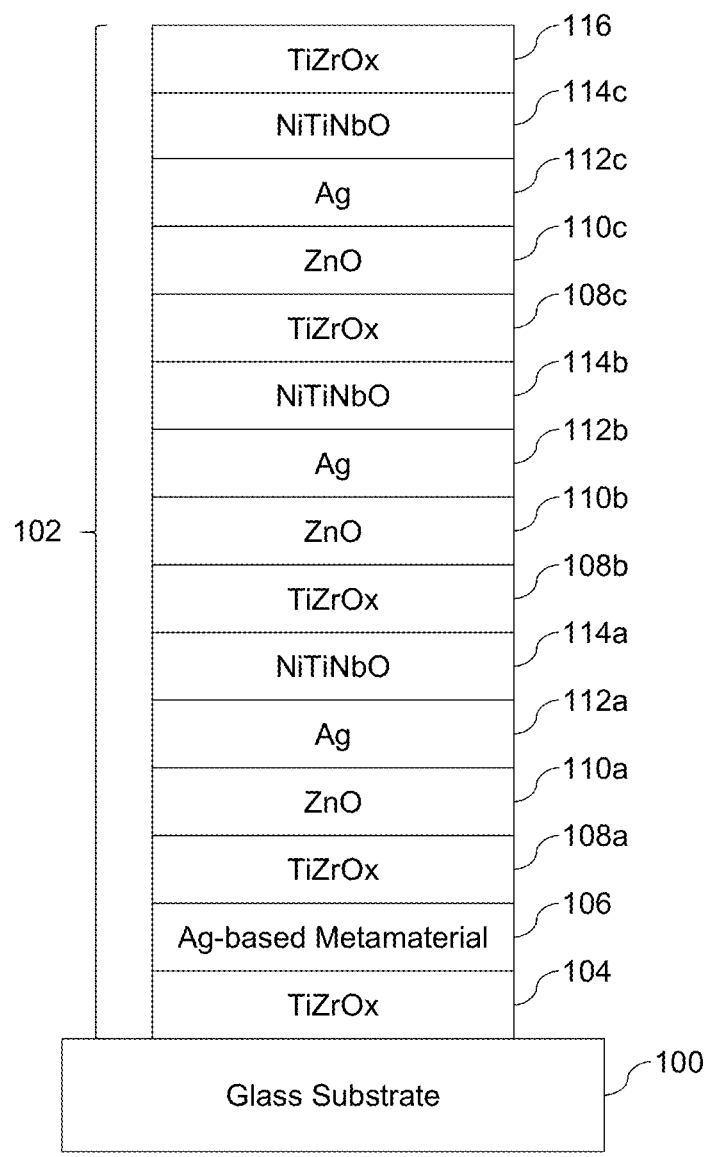
FIG. 1 is a cross-sectional view of an example layer stack having three Ag-inclusive layers and one metamaterial-inclusive layer, in accordance with certain example embodiments.

Certain example embodiments relate to coated articles having a metamaterial-inclusive layer, coatings having a metamaterial-inclusive layer, and/or methods of making the same. Metamaterial-inclusive coatings may be used, for example, in low-emissivity applications, providing for more true color rendering, low angular color dependence, and/or high light-to-solar gain. As indicated above, it would be desirable in many instances to have transmitted color rendering that is true, e.g., such that incident external light is not perceived as having been modified by the film and/or substrate of the window. It is possible to obtain this performance with the FIG. 1 coated article, in certain example embodiments. That is, FIG. 1 is a cross-sectional view of an example layer stack 102 supported by a glass substrate 100 and having three Ag-inclusive layers 112a-112c and one metamaterial-inclusive layer 106, in accordance with certain example embodiments. As shown in FIG. 1, the metamaterial-inclusive layer 106 is the lowest Ag-containing layer in the triple-silver layer stack. That is, the metamaterial-inclusive layer 106 is closer to the substrate 100 than is each of Ag-inclusive layers 112a-112c. In different example embodiments, however, the metamaterial-inclusive layer 106 may be provided elsewhere. For instance, it may be provided between or above a given Ag-containing sub-stack.

A first barrier layer 104 is provided between the glass substrate 100 and the metamaterial-inclusive layer 106. This barrier layer 104 may include titanium oxide and/or zirconium in certain example embodiments. The inclusion of a barrier layer 104 or the like may be advantageous in terms of reducing the likelihood of sodium migration from the substrate into the layer stack 102 (e.g., where it could damage layers including the Ag-inclusive layers 112a-112c, the metamaterial-inclusive layer 106, etc.), especially because the high temperatures that may be used in the formation of the metamaterial-inclusive layer 106 (e.g., as set forth in greater detail below), heat treatment (including heat strengthening and/or thermal tempering), etc., may be likely to promote such sodium migration.

One or more dielectric layers (not shown) also may be interposed between the substrate 100 and the metamaterial-inclusive layer 106. These dielectric layers may be silicon-inclusive layers (e.g., layers comprising silicon oxide, silicon nitride, silicon oxynitride, etc.) that optionally may also include aluminum, layers comprising titanium oxide, layers comprising tin oxide, etc.

FIG. 1 may be thought of as including sub-layer stacks above the metamaterial-inclusive layer 106, with a single sub-layer stack repeating once for each silver-inclusive layer in the overall stack 102. As will be appreciated from FIG. 1, each sub-layer stack includes a barrier layer, a lower contact layer, a layer comprising Ag, and an upper contact layer. In the FIG. 1 example embodiment, the barrier layers 108a-108c comprising titanium and/or zirconium, and may be oxided. Thus, as shown in FIG. 1, the barrier layers 108a-108c each comprise TiZrOx (although TiOx, ZrOx, and/or the like may be used in different example embodiments). In the FIG. 1 example embodiment, the lower contact layers 110a-110c comprising zinc oxide. The lower contact layers 110a-110c may further include tin and/or aluminum in certain example embodiments, and they may provide smooth layers on which the respective layers comprising Ag 112a-112c can grow directly. In the FIG. 1 example embodiment, the upper contact layers 114a-114c are in direct contact with the layers comprising Ag 112a-112c and may include, for example, Ni, Cr, Ti, and/or an oxide thereof. For instance, as shown in FIG. 1, the upper contact layers 114a-114c each comprise NiTiNbO (although NiCrOx, NiTiOx, and/or the like may be used in different example embodiments). An overcoat layer 116 may be provided to help protect the layer stack. The overcoat layer 116 may include zirconium in certain example embodiments. Optionally, certain example embodiments may include additional overcoat layers including, for example, layers comprising silicon (e.g., silicon oxide, silicon nitride, or silicon oxynitride), etc. In certain example embodiments, the barrier layer 104 and the overcoat layer 116 may be formed from the same or different materials.

In certain example embodiments, the thicknesses of the some or all of the contact layers 110a-110c may be substantially the same (e.g., varying by no more than 15% of one another, more preferably varying by no more than 10% of one another). In certain example embodiments, the thicknesses of the some or all of the layers comprising Ag 112a-112c may be substantially the same (e.g., varying by no more than 15% of one another, more preferably varying by no more than 10% of one another). In certain example embodiments, the thicknesses of the innermost and outermost layers may be substantially the same (e.g., varying by no more than 15% of one another, more preferably varying by no more than 10% of one another).

The following table provides information about the layers in the FIG. 1 example coated article.

| Layer | Preferred Thickness (nm) | More Preferred Thickness (nm) | Example Thickness (nm) |
|---|---|---|---|
| Glass (100) | | | |
| TiZrOx (104) | 20-100 | 30-50 | 39 |
| Metamaterial (106) | 5-25 | 5-15 | 13 |
| TiZrOx (108a) | 10-120 | 30-100 | 64 |
| ZnO (110a) | 1-20 | 3-15 | 4 |
| Ag (112a) | 5-50 | 10-25 | 15 |
| NiTiNbO (114a) | 1-20 | 1-10 | 3 |
| TiZrOx (108b) | 10-120 | 30-100 | 60 |
| ZnO (110b) | 1-20 | 3-15 | 4 |
| Ag (112b) | 5-50 | 10-25 | 16 |
| NiTiNbO (114b) | 10-120 | 30-100 | 47 |
| TiZrOx (108c) | 1-20 | 3-15 | 8 |
| ZnO (110c) | 1-20 | 3-15 | 4 |
| Ag (112c) | 5-50 | 10-25 | 17 |
| NiTiNbO (114c) | 1-20 | 1-10 | 3 |
| TiZrOx (116) | 20-100 | 30-50 | 31 |

Figure 2A:
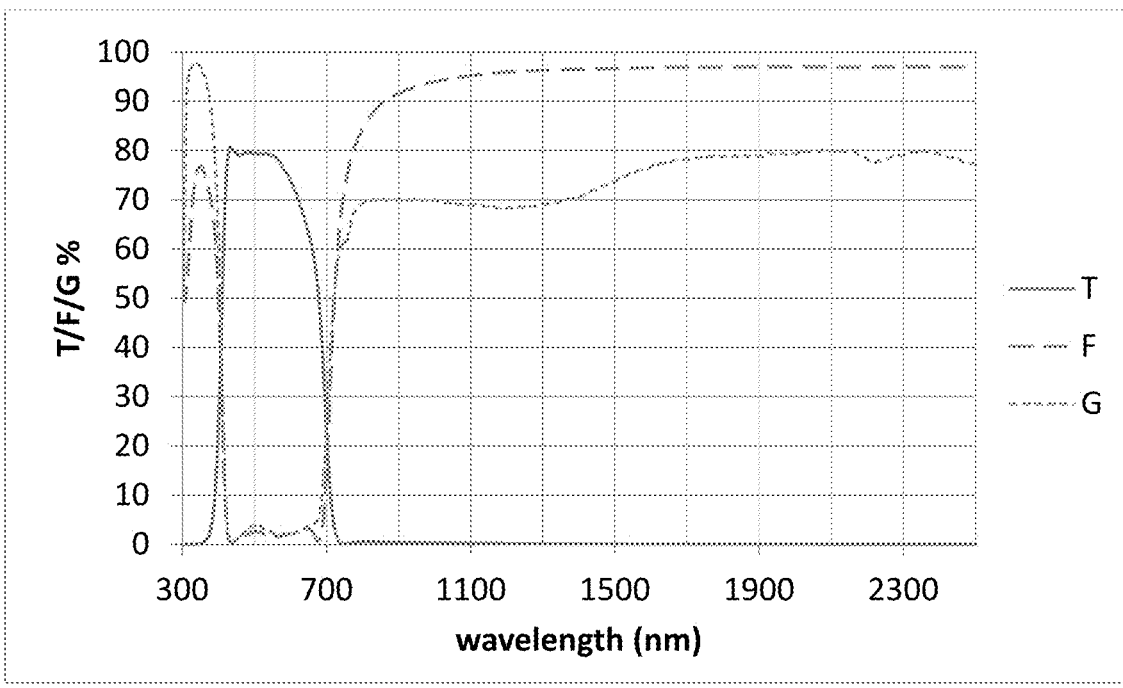
FIG. 2a is a graph plotting the transmission, film-side reflectance, and glass-side reflectance against wavelength for the FIG. 1 example coated article.

Optical properties of the FIG. 1 example coated article are provided in FIG. 2a. That is, FIG. 2a is a graph plotting the transmission, film-side reflectance, and glass-side reflectance against wavelength for the FIG. 1 example coated article. The following table summarizes these and other optical properties, as well as thermal performance.

| Monolithic Optics (Ill. 'C', 2 deg obs) | T | Y (%) | 76.8 |
|---|---|---|---|
| | | a* | −5.00 |
| | | b* | −1.34 |
| | Rg | Y (%) | 2.7 |
| | | a* | −1.06 |
| | | b* | −0.58 |
| | Rf | Y (%) | 2.0 |
| | | a* | 4.04 |
| | | b* | −0.55 |
| | A[vis] (100-TT-Rf) | | 21.2 |

-continued

| | | | |
|---|---|---|---|
| Double Glazing/IGU Optics (Ill. 'C', 2 deg obs) | T | Y (%) | 69.5 |
| | | a* | −5.47 |
| | | b* | −1.17 |
| | Rg | Y (%) | 7.5 |
| | | a* | −3.45 |
| | | b* | −1.45 |
| | Rf | Y (%) | 9.8 |
| | | a* | 0.77 |
| | | b* | −0.66 |
| Normal Emissivity (EN) | | | 0.02 |
| Double Glazing/IGU NFRC-2001 Thermal Performance | Tvis (%) | | 69.5 |
| | Tsol (%) | | 25.4 |
| | Rsol (%) | | 46.1 |
| | Asol (%) | | 28.5 |
| | Uval | | 0.253 |
| | SHGC | | 27.5 |
| | LSG(25) | | 2.53 |

In these samples, the IG units included two 3 mm substrates that were 12 mm apart from one another. All samples were on clear glass.

The small a* and b* values are indicative of an excellent transmitted color and, as can be seen, the LSG is still high. With respect to a* and b*, the coloration is generally neutral and, in any event, different from the yellow-green color shift that oftentimes accompanies solar control coatings. It thus can be seen that certain example embodiments advantageously provide for excellent, neutral transmitted color, which maintaining a high LSG, in connection with a layer stack that has three Ag-inclusive layers and one metamaterial layer. The transmitted color rendering thus is true. In some instances, it is possible to avoid any yellow-green color shift, even though other color shifts might occur.

Also as indicated above, it would be desirable in many instances to reduce the severity of or possibly even completely eliminate the tradeoff between angular coloration and LSG. That is, it would be desirable to avoid having to sacrifice angular coloration in order to obtain high LSG values. It also is possible to obtain this performance with the FIG. 1 coated article, in certain example embodiments.

Figure 2B:
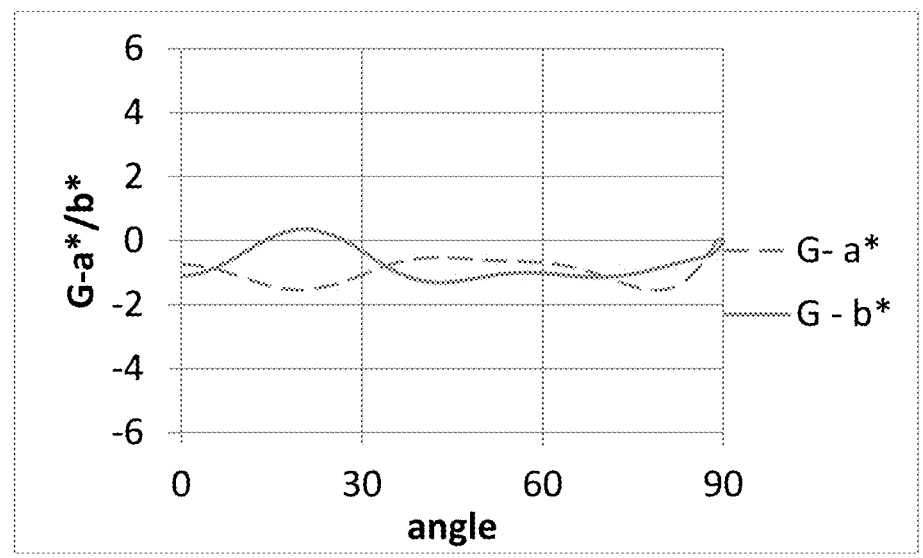
FIG. 2b is a graph plotting glass-side a* and b* values against viewing angle for the FIG. 1 example coated article.

FIG. 2b is a graph plotting glass-side a* and b* values against viewing angle for the FIG. 1 example coated article. As can be seen from FIG. 2b, the glass-side a* and b* values are fairly uniform over the entire range from 0-90 degrees. Preferably, the glass-side a* and b* values vary by no more than 2 over this range, more preferably no more than 1.75, still more preferably no more than 1.5, and sometimes no more than 1.0. In certain example embodiments, the glass-side a* and b* values are between 0 and −2 for substantially all angles between 0 and 90 degrees. It also can be seen from the FIG. 2b graph that glass-side a* and b* values each are very uniform in the 30-90 degree range and in each of the 30-60 and 60-90 degree ranges.

Figure 3A:
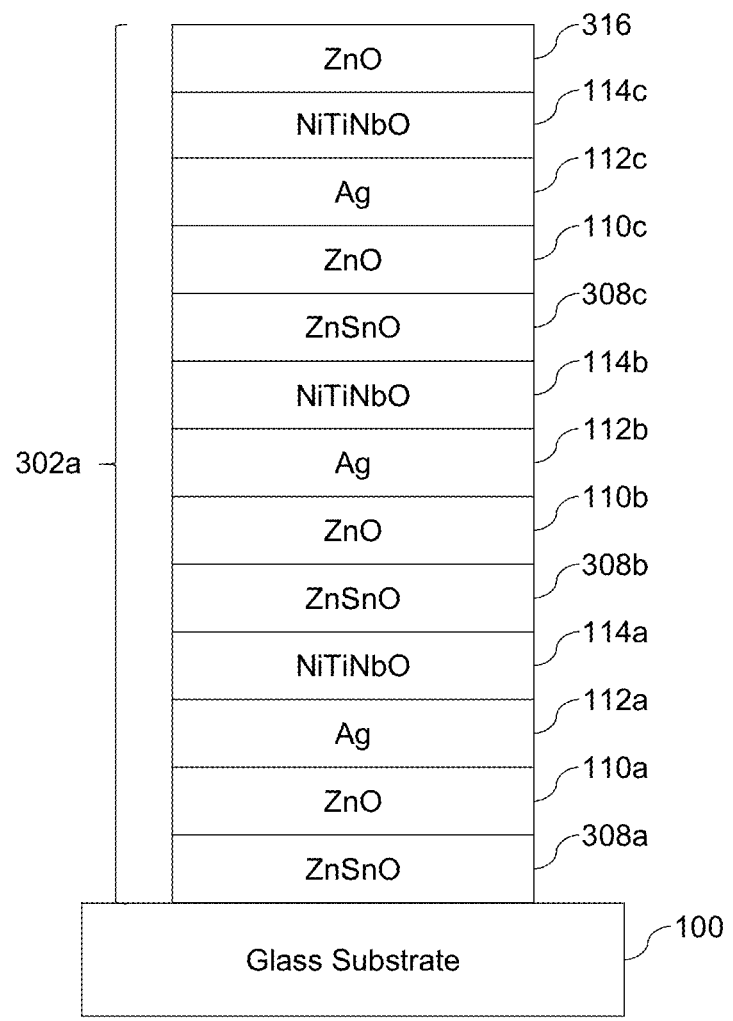
FIGS. 3a-3c are cross-sectional views of example triple silver low-E coatings that have been tuned to provide improved angular coloration and high LSG.
Figure 3B:
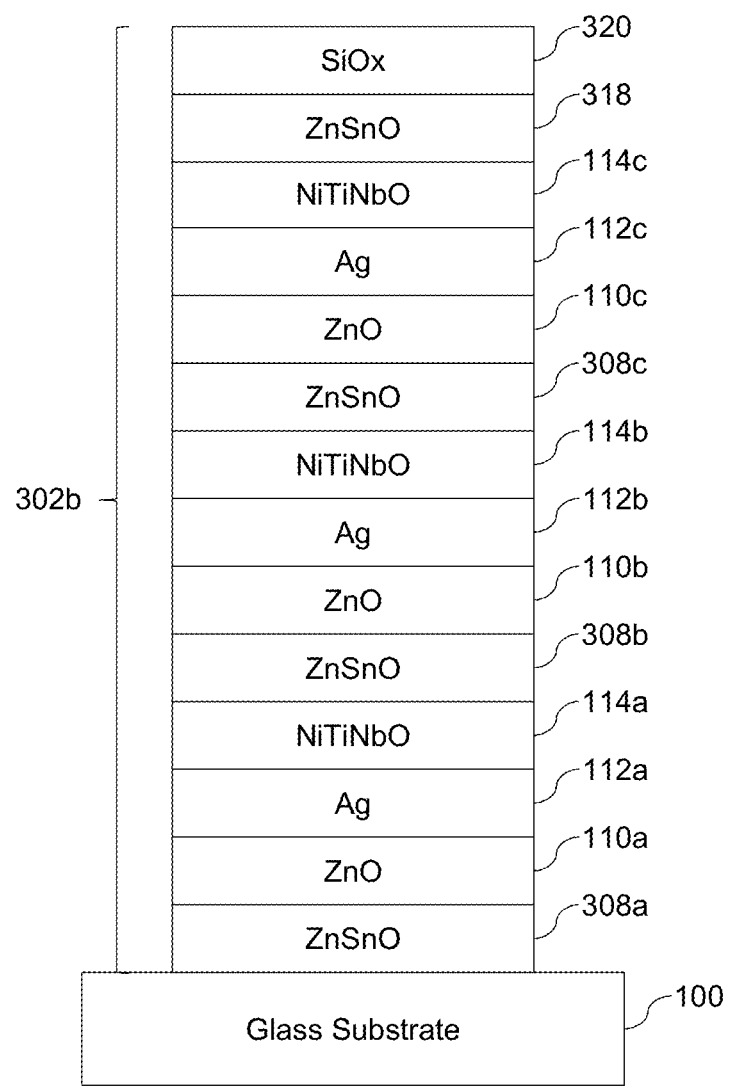
Figure 3C:
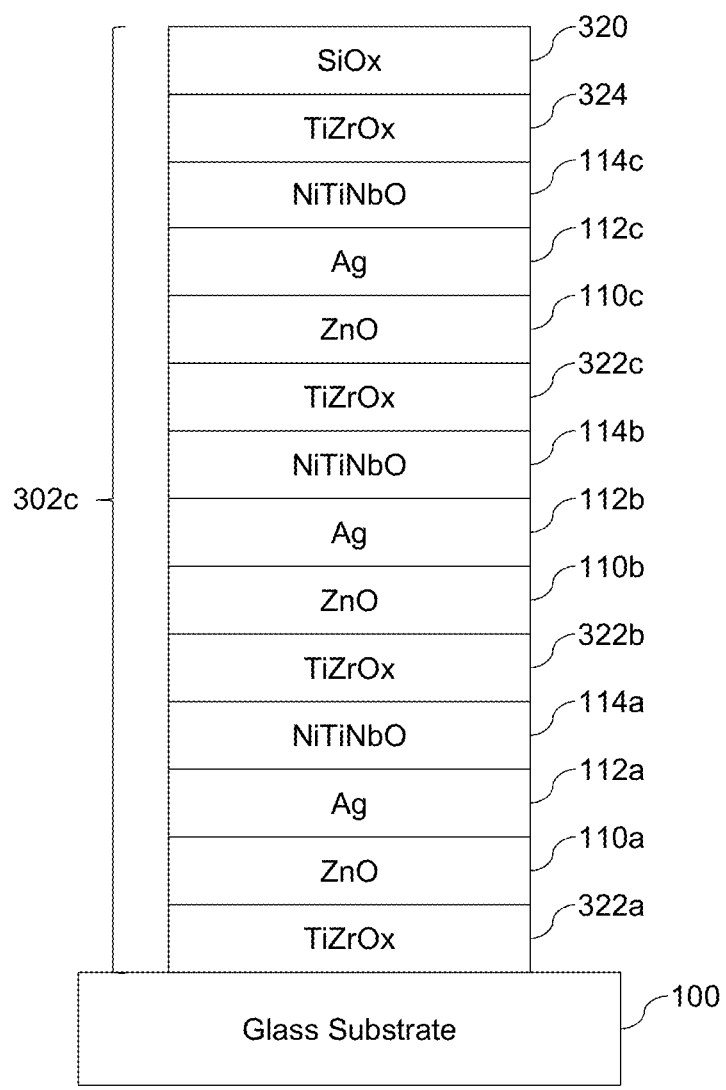

Performance of the FIG. 1 example coated article has been tested against other more conventional triple silver low-E coatings that have been tuned. In this regard, FIGS. 3a-3c are cross-sectional views of example triple silver low-E coatings that have been tuned to provide improved angular coloration and high LSG. The following tables provide information about the layers in the example coated articles shown in FIGS. 3a-3c.

The FIG. 3a layer stack 302a, somewhat similar to the FIG. 1 layer stack 102, includes a sub-layer stack for each silver-inclusive layer in the overall stack 102. As will be appreciated from FIG. 1, each sub-layer stack includes a barrier layer, a lower contact layer, a layer comprising Ag, and an upper contact layer. Furthermore, like the FIG. 1 example, the lower contact layers 110a-110c each may comprise zinc oxide, and the upper contact layers 114a-114 each may comprise, for example, Ni, Cr, Ti, and/or an oxide thereof. For instance, as shown in FIG. 3a, the upper contact layers 114a-114c each comprise NiTiNbO. The lower contact layers 110a-110c and the upper contact layers 114a-114c sandwich the layers comprising silver 112a-112c. The barrier layers differ as between the FIG. 1 and FIG. 3a examples. In FIG. 3a, the barrier layers 308a-308c, provided below the lower contact layers 110a-110c, each comprise ZnSnO (although SnO may be used in certain example instances). The FIG. 3a example also includes an overcoat layer 316 comprising zinc oxide.

The following table provides information about the layers in the FIG. 3a example coated article.

| Layer | Preferred Thickness (nm) | More Preferred Thickness (nm) | Example Thickness (nm) |
|---|---|---|---|
| Glass (100) | | | |
| ZnSnO (308a) | 10-120 | 20-100 | 20 |
| ZnO (110a) | 1-20 | 3-15 | 4 |
| Ag (112a) | 5-50 | 10-25 | 11 |
| NiTiNbO (114a) | 1-20 | 1-10 | 3 |
| ZnSnO (308b) | 10-120 | 30-100 | 62 |
| ZnO (110b) | 1-20 | 3-15 | 4 |
| Ag (112b) | 5-50 | 10-25 | 14 |
| NiTiNbO (114b) | 1-20 | 1-10 | 3 |
| ZnSnO (308c) | 10-120 | 30-100 | 67 |
| ZnO (110c) | 1-20 | 3-15 | 4 |
| Ag (112c) | 5-50 | 10-25 | 17 |
| NiTiNbO (114c) | 1-20 | 1-10 | 3 |
| ZnO (316) | 20-100 | 30-50 | 38 |

The layer stack 302b shown in FIG. 3b is similar to the layer stack 302a shown in FIG. 3a. However, the overcoat layer 316 comprising zinc oxide from FIG. 3a is replaced with a two-layer overcoat including a layer comprising ZnSnO 318 and a silicon-inclusive layer 320 (which in the FIG. 3b example includes silicon oxide, but which may instead include silicon nitride or silicon oxynitride).

The following table provides information about the layers in the FIG. 3b example coated article.

| Layer | Preferred Thickness (nm) | More Preferred Thickness (nm) | Example Thickness (nm) |
|---|---|---|---|
| Glass (100) | | | |
| ZnSnO (308a) | 10-120 | 20-100 | 34 |
| ZnO (110a) | 1-20 | 3-15 | 4 |
| Ag (112a) | 5-50 | 10-25 | 11 |
| NiTiNbO (114a) | 1-20 | 1-10 | 3 |
| ZnSnO (308b) | 10-120 | 30-100 | 58 |
| ZnO (110b) | 1-20 | 3-15 | 4 |
| Ag (112b) | 5-50 | 10-25 | 13 |
| NiTiNbO (114b) | 1-20 | 1-10 | 3 |
| ZnSnO (308c) | 10-120 | 30-100 | 54 |
| ZnO (110c) | 1-20 | 3-15 | 4 |
| Ag (112c) | 5-50 | 10-25 | 12 |
| NiTiNbO (114c) | 1-20 | 1-10 | 3 |
| ZnSnO (318) | 1-20 | 3-15 | 5 |
| SiOx (320) | 20-100 | 30-50 | 40 |

The layer stack 302c shown in FIG. 3c is similar to the layer stack 302b shown in FIG. 3b, and may be regarded as being the closest to FIG. 1 (at least when compared to the other examples shown in and described in connection with FIGS. 3a-3b). Compared to FIG. 3b, however, the layer of the overcoat comprising ZnSnO 318 is replaced with a layer 324 comprising titanium and/or zirconium. In the FIG. 3c example, this layer 324 comprises TiZrOx. The same material is used for the barrier layers in the FIG. 3c example. That is, rather than having barrier layers 308a-308c comprising ZnSnO or the like as in FIG. 3b, FIG. 3c shows barrier layers 322a-322c comprising TiZrOx.

The following table provides information about the layers in the FIG. 3c example coated article.

| Layer | Preferred Thickness (nm) | More Preferred Thickness (nm) | Example Thickness (nm) |
| --- | --- | --- | --- |
| Glass (100) | | | |
| TiZrOx (322a) | 10-120 | 20-100 | 26 |
| ZnO (110a) | 1-20 | 3-15 | 4 |
| Ag (112a) | 5-50 | 10-25 | 12 |
| NiTiNbO (114a) | 1-20 | 1-10 | 3 |
| TiZrOx (322b) | 10-120 | 30-100 | 51 |
| ZnO (110b) | 1-20 | 3-15 | 4 |
| Ag (112b) | 5-50 | 10-25 | 12 |
| NiTiNbO (114b) | 1-20 | 1-10 | 3 |
| TiZrOx (322c) | 10-120 | 30-100 | 43 |
| ZnO (110c) | 1-20 | 3-15 | 4 |
| Ag (112c) | 5-50 | 10-25 | 12 |
| NiTiNbO (114c) | 1-20 | 1-10 | 3 |
| TiZrOx (324) | 1-20 | 3-15 | 4 |
| SiOx (320) | 20-100 | 30-50 | 36 |

Figure 4:
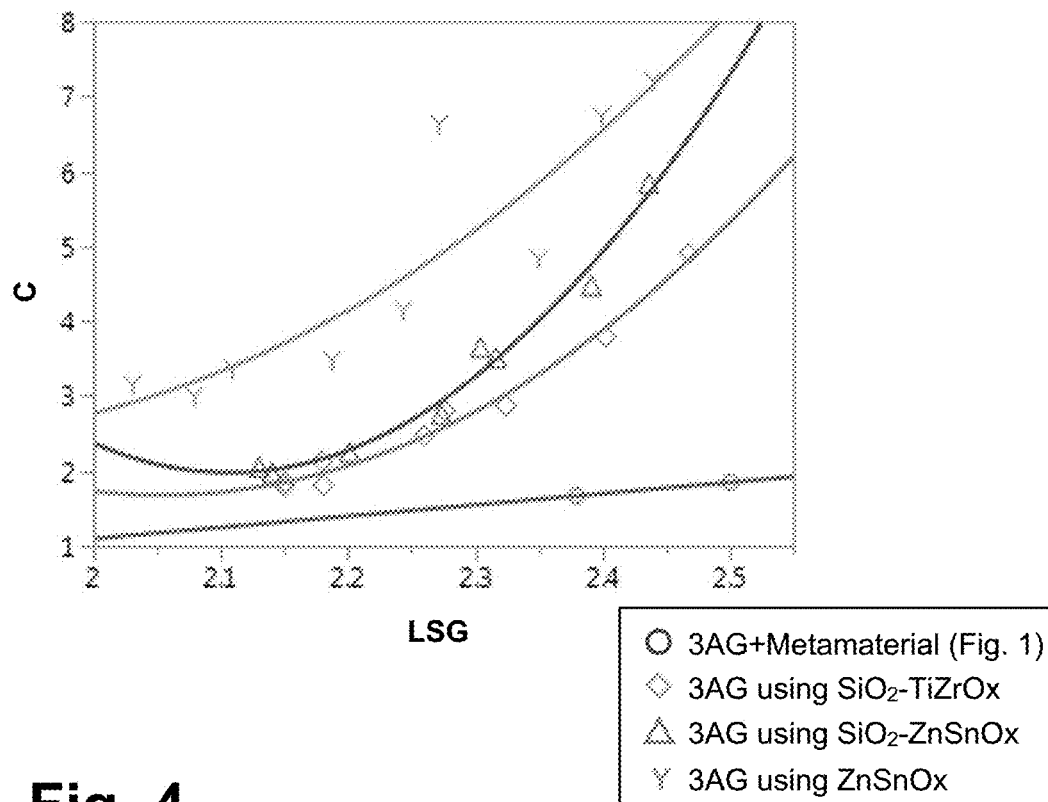
FIG. 4 is a graph plotting C vs. LSG values for the example coated articles shown in and described in connection with FIGS. 1 and 3a-3c.

FIG. 4 is a graph plotting C vs. LSG values for the example coated articles shown in and described in connection with FIGS. 1 and 3a-3c. Here, C is color and C= $\sqrt{(a^*_1-a^*_2)^2+(b^*_1-b^*_2)^2}$. As can be seen from FIG. 4, a triple silver low-E coating including a layer comprising ZnSnOx (corresponding to FIG. 3a) can be improved upon in terms of its C and LSG performance by using layers comprising silicon oxide and zinc stanate (corresponding to FIG. 3b), and that coating can be improved upon yet further by using layers comprising silicon oxide and TiZrOx (corresponding to FIG. 3c). However, none of these tuned layers provides the combination of C and LSG performance as the FIG. 1 example embodiments, which has a metamaterial-inclusive layer. In other words, triple silver stacks with one metamaterial layer can achieve superior LSG without compromising on angular color shift. It thus can be seen that certain example embodiments advantageously additionally provide for superior LSG without sacrificing angular coloration.

From a perhaps more basic perspective, five samples were created and tested to compare and contrast the optical performance of metamaterial-inclusive layer stacks and more conventional Ag-inclusive low-E layer stacks. The samples were as follows:

Sample 1: One 13 nm thick metamaterial layer on 3 mm thick clear float glass

Sample 2: One 10.6 nm thick layer comprising Ag on 3 mm thick clear float glass

Figure 5A:
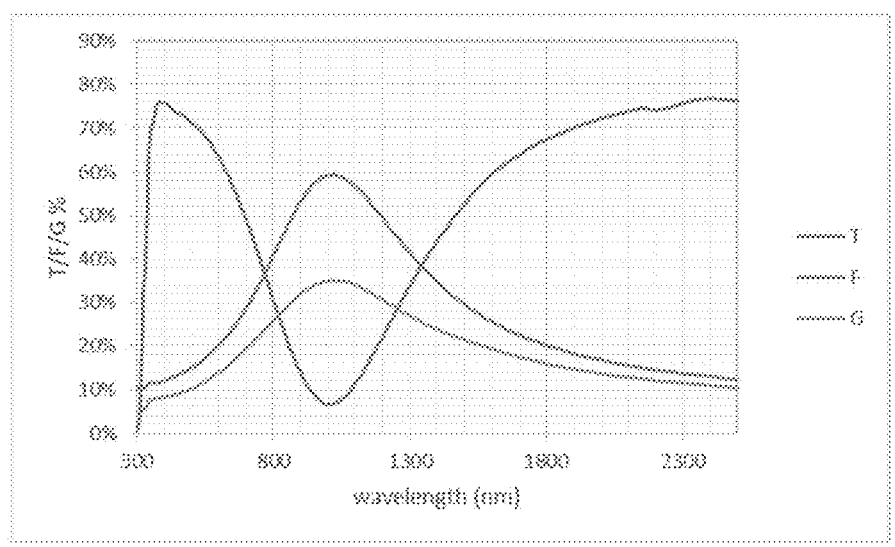
FIG. 5a is a graph plotting the transmission, film-side reflectance, and glass-side reflectance against wavelength for a sample including a single metamaterial-inclusive layer on a glass substrate, and FIG. 5b plots the glass-side a* and b* values against angle for that sample.
Figure 5B:
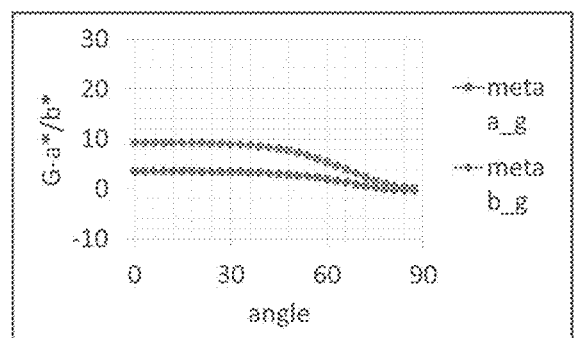

Sample 3: 3 mm thick clear float glass/13 nm thick layer metamaterial layer/10.6 nm thick layer comprising Ag Sample 4: 3 mm thick clear float glass/first layer comprising silicon nitride (e.g., $Si_3N_4$) that was 35 nm thick/second layer comprising silicon nitride (e.g., $Si_3N_4$) that was 75.1 nm thick/10.6 nm thick layer comprising Ag/third layer comprising silicon nitride (e.g., $Si_3N_4$) that was 15.8 nm thick/layer comprising silicon oxide (e.g., $SiO_2$) that was 51.4 nm thick Sample 5: 3 mm thick clear float glass/first layer comprising silicon nitride (e.g., $Si_3N_4$) that was 35 nm thick/13 nm thick layer metamaterial layer/second layer comprising silicon nitride (e.g., $Si_3N_4$) that was 75.1 nm thick/10.6 nm thick layer comprising Ag/third layer comprising silicon nitride (e.g., $Si_3N_4$) that was 15.8 nm thick/layer comprising silicon oxide (e.g., $SiO_2$) that was 51.4 nm thick FIG. 5a plots the transmission, film-side reflectance, and glass-side reflectance against wavelength for sample 1, and FIG. 5b plots the glass-side a* and b* values against angle for sample 1. As can be seen from FIG. 5a, the metamaterial single layer example shows significant changes for transmission, film-side reflectance, and glass-side reflectance in the 800-900 nm spectra. However, as can be seen from FIG. 5b, the angular coloration is good but could be improved. That is, the glass-side a* and b* values are fairly high and change with viewing angle.

Figure 6A:
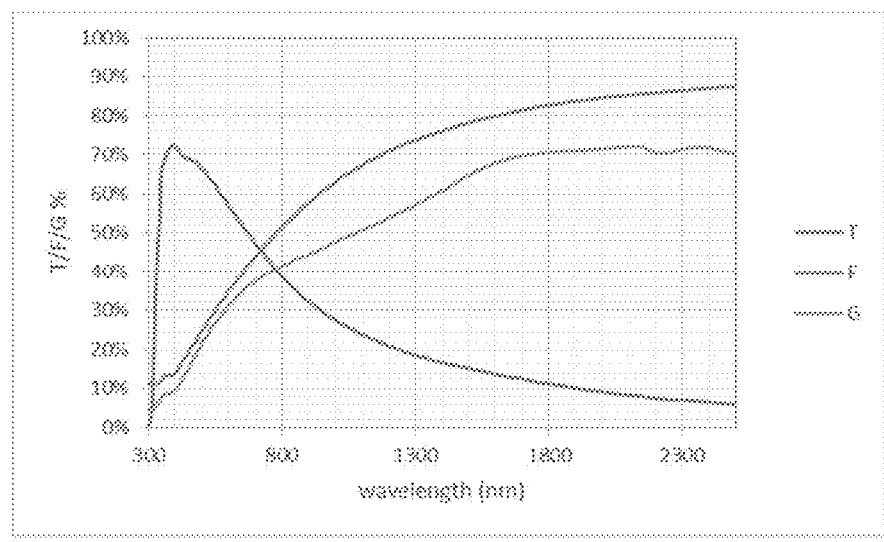
FIG. 6a is a graph plotting the transmission, film-side reflectance, and glass-side reflectance against wavelength for a sample including a single Ag-inclusive layer (a layer comprising or consisting essentially of Ag) on a glass substrate, and FIG. 6b plots the glass-side a* and b* values against angle for that sample.
Figure 6B:
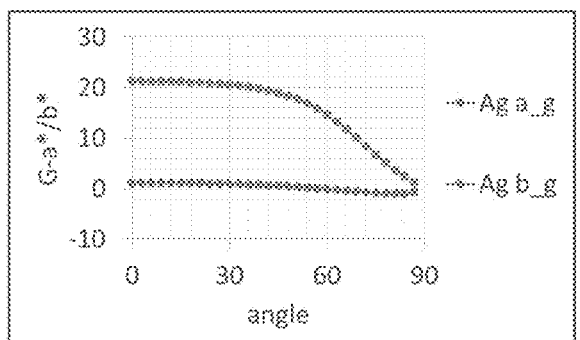

FIG. 6a plots the transmission, film-side reflectance, and glass-side reflectance against wavelength for sample 2, and FIG. 6b plots the glass-side a* and b* values against angle for sample 2. As can be seen from FIG. 6a, there is a continuous change across the whole visible spectrum and into the NIR region. However, as can be seen from FIG. 6b, angular coloration is quite poor, particularly with respect to the glass-side a* value being very high and having a significant change from about 45 degrees to 90 degrees.

Figure 7A:
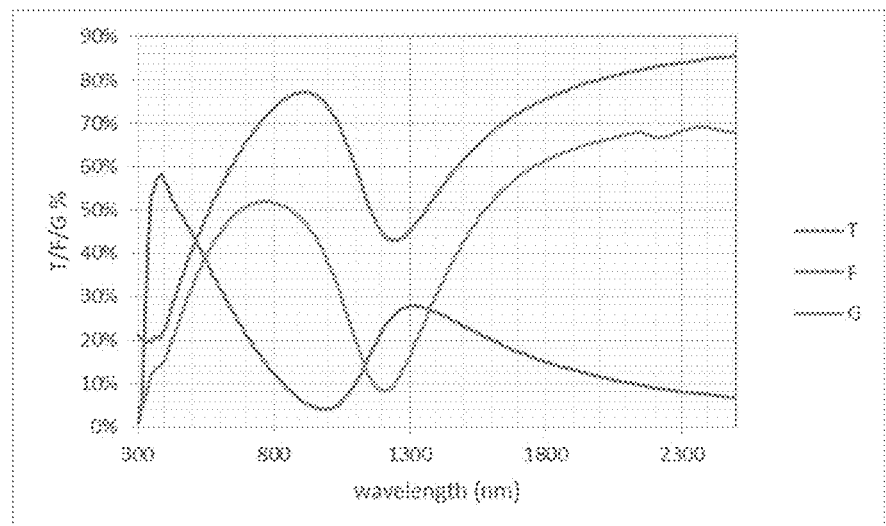
FIG. 7a is a graph plotting the transmission, film-side reflectance, and glass-side reflectance against wavelength for a sample including a single Ag-inclusive layer (a layer comprising or consisting essentially of Ag) supported by a single metamaterial layer on a glass substrate, and FIG. 7b plots the glass-side a* and b* values against angle for that sample.
Figure 7B:
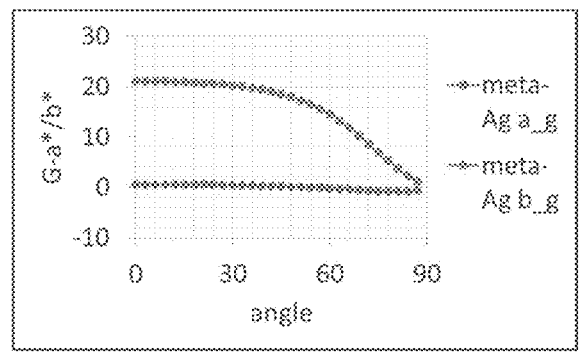

FIG. 7a plots the transmission, film-side reflectance, and glass-side reflectance against wavelength for sample 3, and FIG. 7b plots the glass-side a* and b* values against angle for sample 3. As can be seen from FIG. 7a, the contribution from the metamaterial and the Ag thin film is combined, e.g., roughly as if the FIGS. 5a and 5b charts were combined. However, as can be seen from FIG. 7b, the angular color still is not good.

Figure 8A:
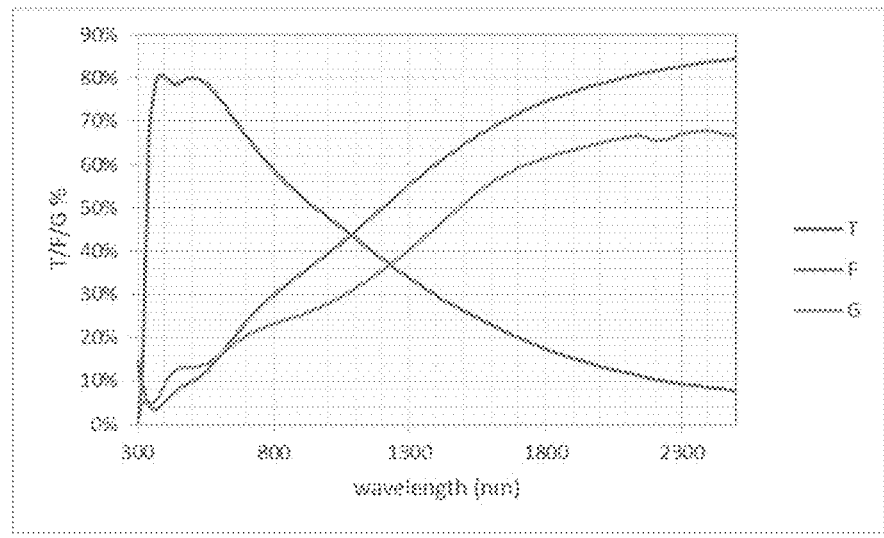
FIGS. 8a and 8b correspond to FIGS. 6a and 6b, except that additional dielectric layers are provided for optical tuning.
Figure 8B:
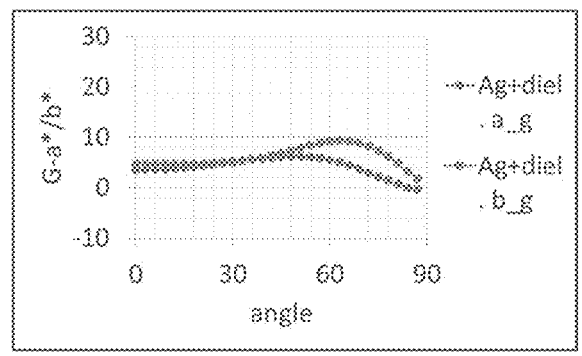

As will be appreciated from the description of the samples above, samples 2-3 were improved by adding dielectric layers for optical tuning purposes. In this regard, FIGS. 8a-8b correspond to FIGS. 6a-6b, except that additional dielectric layers are provided for optical tuning in connection with sample 4. As will be appreciated from FIGS. 8a-8b, further tuning is possible through the inclusion of dielectric layers. That is, the transmission is higher in a wider visible wavelength range, and there is a marked improvement in coloration as reflected in FIG. 8b.

Figure 9A:
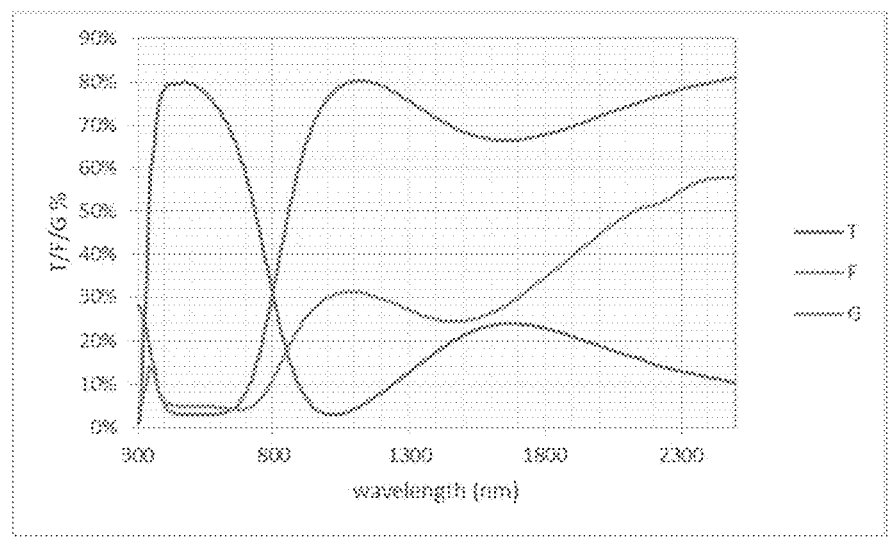
FIGS. 9a and 9b correspond to FIGS. 7a and 7b, except that additional dielectric layers are provided for optical tuning.
Figure 9B:
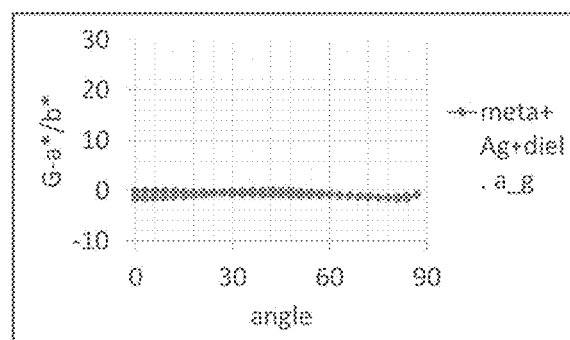

FIGS. 9a-9b correspond to FIGS. 7a-7b, except that additional dielectric layers are provided for optical tuning in connection with sample 5. The addition of dielectric layers helps tune the response yet further, maintaining good transmittance over the visible wavelength range and also resulting in a much improved film-side reflectance in infrared spectra starting much earlier compared to FIG. 8a, etc. Moreover, as can be seen from FIG. 9b, angular coloration is excellent once dielectric spacers are provided. The glass-side a* and b* values are both close to each other and extremely close to 0 throughout the 0-90 degree viewing angle.

The following table provides optical performance for samples 1-5.

|  |  |  | Sample 1 | Sample 2 | Sample 3 | Sample 4 | Sample 5 |
|---|---|---|---|---|---|---|---|
| Monolithic Optics (III 'C', 2 deg obs) | T | Y (%) | 67.2 | 61.27 | 37.57 | 77.77 | 76.36 |
|  |  | a* | −3.17 | −3.06 | −3.53 | −2.9 | −3.03 |
|  |  | b* | −5.25 | −6.67 | −13.84 | −1.05 | −2.47 |
|  | Rg | Y (%) | 12.2 | 27 | 39.5 | 14.5 | 4.7 |
|  |  | a* | 3.57 | 1.16 | 0.59 | 3.59 | −0.06 |
|  |  | b* | 9.29 | 21.28 | 21.08 | 4.75 | −1.39 |
|  | Rf | Y (%) | 17.7 | 30.6 | 48.9 | 12.9 | 3 |
|  |  | a* | 4.1 | 2.46 | 1.63 | 5.84 | 3.45 |
|  |  | b* | 9.77 | 18 | 19.31 | 14.39 | −0.93 |
|  | Tvis (%) |  | 67.2 | 61.3 | 37.6 | 77.8 | 76.4 |
|  | Tsol (%) |  | 46.4 | 41.4 | 24.2 | 57.3 | 42.1 |
|  | Rsol (%) |  | 20.4 | 40.2 | 39.7 | 26.1 | 16 |
|  | Asol |  | 33.1 | 18.4 | 36.1 | 16.6 | 41.9 |
|  | Uval |  | 0.596 | 0.596 | 0.596 | 0.596 | 0.596 |
|  | SHGC |  | 51.23 | 43.93 | 29.45 | 59.59 | 48.35 |
|  | LSG (25) |  | 1.312 | 1.395 | 1.276 | 1.305 | 1.579 |

It can be seen from this table and the description provided above that optical color and transmission is not good until the dielectric layers were provided. Then, it was possible to achieve excellent coloration and LSG values, particularly where an Ag-inclusive layer and a metamaterial layer is provided (i.e., sample 5). It will be appreciated that further tuning using one or more dielectric layer(s) may be performed in order to realize yet further improvements in these and/or other regards.

A metamaterial-inclusive layer may include a plurality of island-like or other growths on a substrates in a discontinuous, interrupted stratum or collection of material. The growths may have different shapes and sizes, and the configurations of the growths play a role in conditioning the oscillating electron cloud and, thus, controlling the resonance frequency. Geometric parameters that may be optimized include diameter or major distance (d); thickness (t); and interparticle distance (e), which represents the minimum distance between two adjacent particles. Resonance wavelength (in nm) is the wavelength for the minimum in transmittance, and the resonance intensity is the transmittance at the resonance wavelength.

In a related regard, different materials may have different electronic densities and, thus, cause the resonance to occur at different wavelengths. For example, Ag, Cu, Al, AZO, Au, $RuO_2$, ITO, Cr, Ti, and other materials are known to have different extension coefficients and solar spectral irradiances. Thus, it would be desirable to select a configuration for the growth that would be advantageous in terms of low-E performance and visible light transmission. These materials may be used in connection with, or in place of Ag, in certain example embodiments.

Figure 10A:
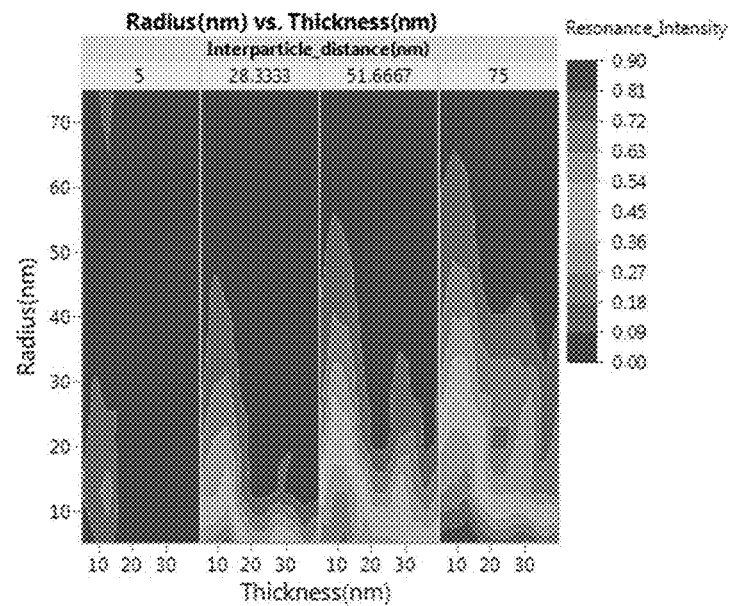
FIGS. 10a-10b show the resonance intensity and resonance wavelength for different radius, thickness, and interparticle distance combinations for columnar Ag metamaterial formations in a silicon oxide matrix.
Figure 10B:
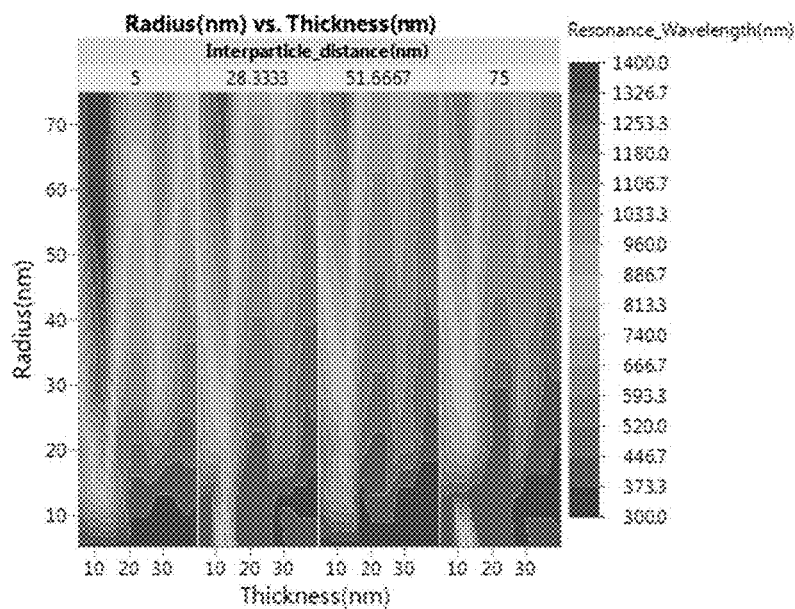

Finite-Difference Time-Domain (FDTD) mappings were performed to investigate the effects of different metamaterial geometries and materials. As is known, FDTD is a numerical analysis technique used for modeling computational electrodynamics. FIGS. 10a-15b are graphs plotting FDTD mapping responses for different metamaterials and configurations. More particularly, FIGS. 10a-10b show the resonance intensity and resonance wavelength for different radius, thickness, and interparticle distance combinations for columnar Ag metamaterial formations in a silicon oxide matrix. The desired wavelength range here is the 960.0-1033.3 nm wavelength.

Figure 11:
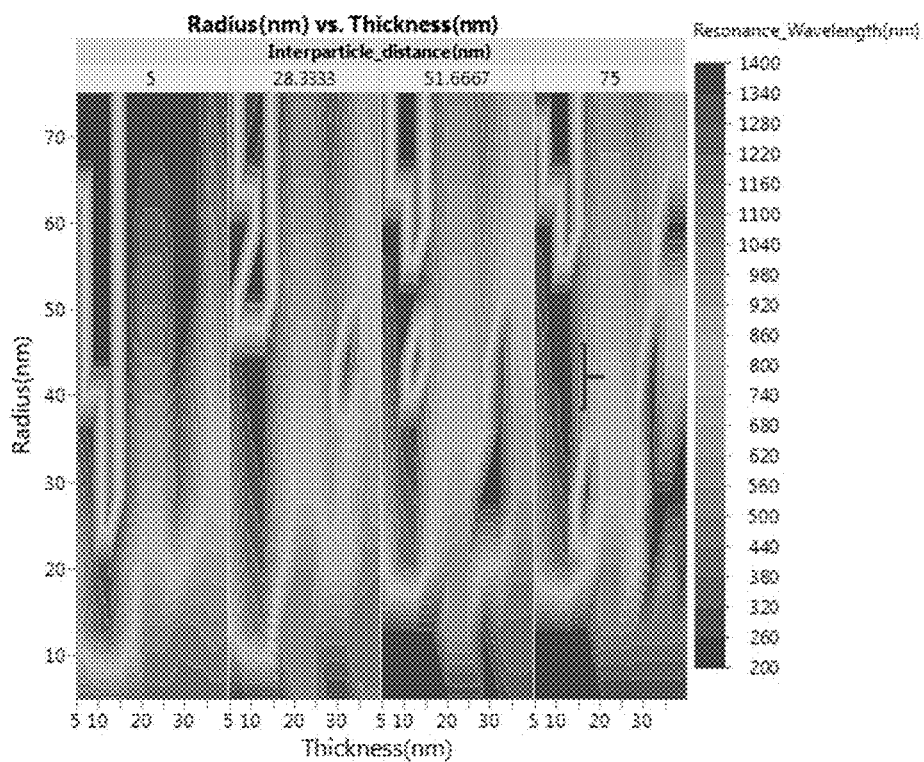
FIG. 11 shows the resonance wavelength for different radius, thickness, and interparticle distance combinations for columnar Ag metamaterial formations in a niobium oxide matrix.

FIG. 11 shows the resonance wavelength for different radius, thickness, and interparticle distance combinations for columnar Ag metamaterial formations in a niobium oxide matrix for columnar Ag metamaterial formations in a silicon oxide matrix. There is a matrix refractive index effect on the resonance wavelength. In this case, there is a clear redshift of the resonance when using the higher index NbOx matrix material, e.g., as annotated with the brace in FIG. 11. In a nutshell, it has been found that higher refractive index matrix materials shift the resonance towards higher wavelengths.

Figure 12A:
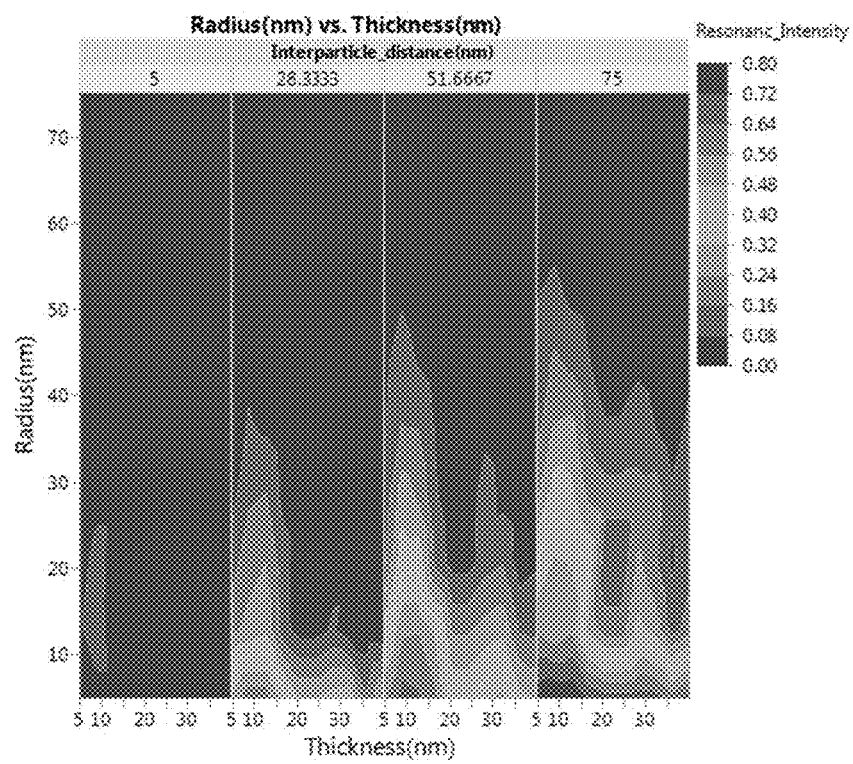
FIGS. 12a-12b show the resonance intensity and resonance wavelength for different radius, thickness, and interparticle distance combinations for columnar Au metamaterial formations in a silicon oxide matrix.
Figure 12B:
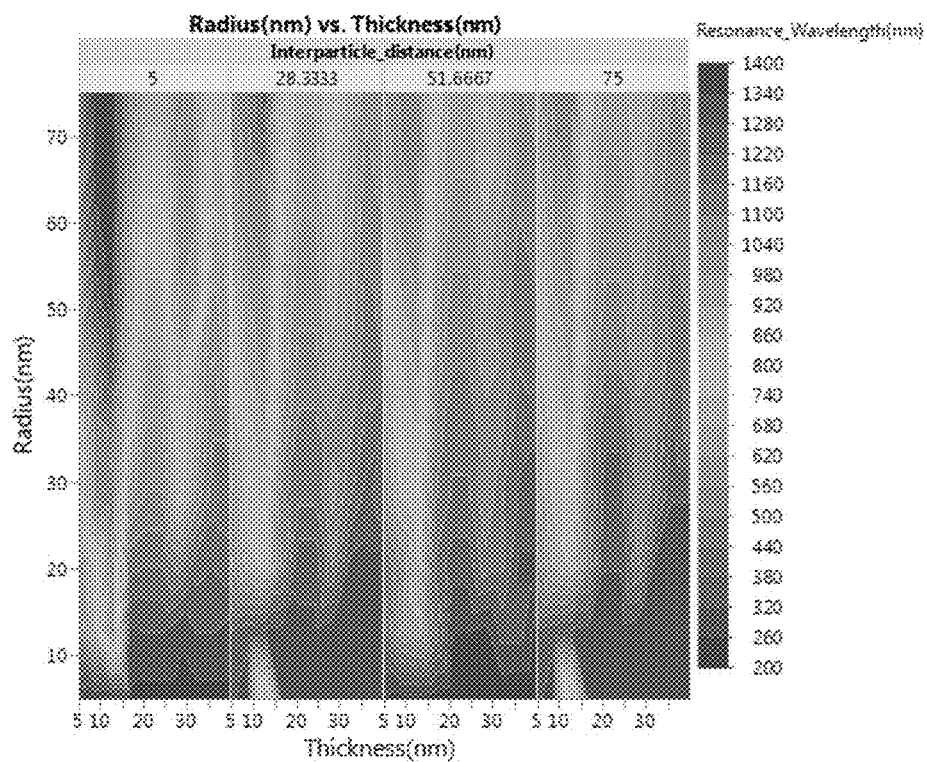

FIGS. 12a-12b show the resonance intensity and resonance wavelength for different radius, thickness, and interparticle distance combinations for columnar Au metamaterial formations in a silicon oxide matrix. As will be appreciated from a comparison between FIGS. 10a-10b and FIGS. 12a-12b, the FDTD results are nearly identical as between Au and Ag in terms of both resonance wavelength and intensity.

Figure 13A:
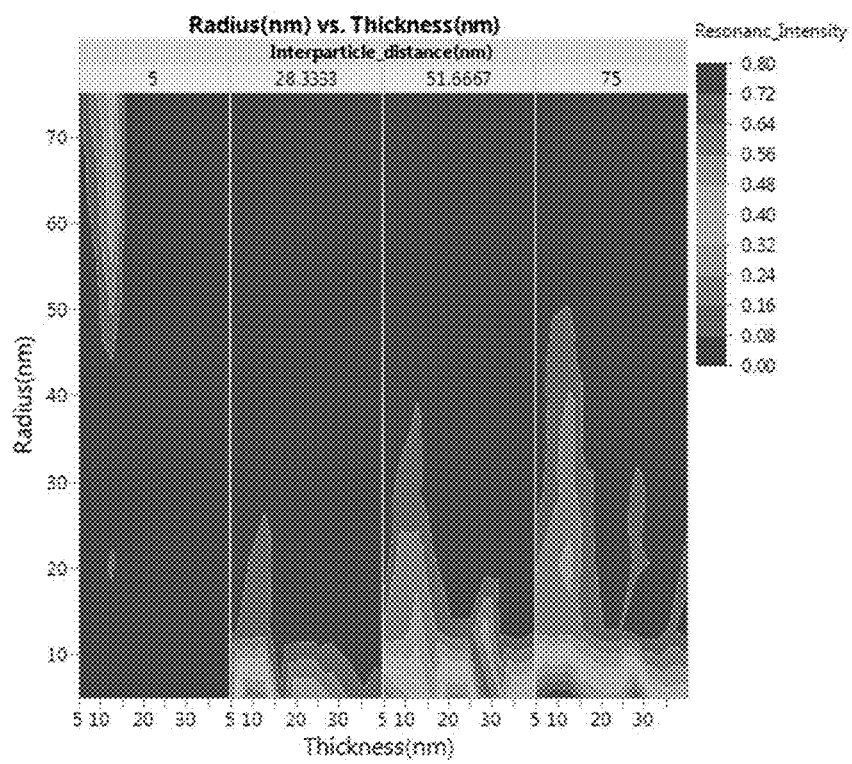
FIGS. 13a-13b show the resonance intensity and resonance wavelength for different radius, thickness, and interparticle distance combinations for columnar Cu metamaterial formations in a silicon oxide matrix.
Figure 13B:
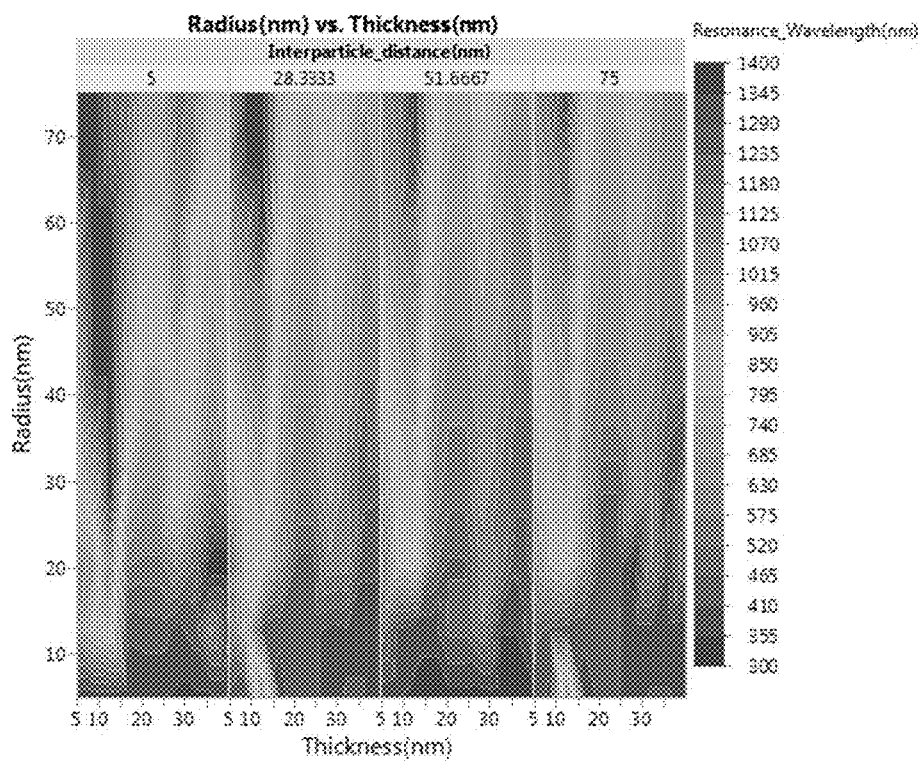

FIGS. 13a-13b show the resonance intensity and resonance wavelength for different radius, thickness, and interparticle distance combinations for columnar Cu metamaterial formations in a silicon oxide matrix. It will be appreciated that the Cu has a higher optical absorption in the visible spectrum, but excellent electronic density and conductivity. Thus, it might sometimes be desirable to use Cu instead of Au and/or Ag, e.g., in view of the more conductive properties of Cu.

Figure 14A:
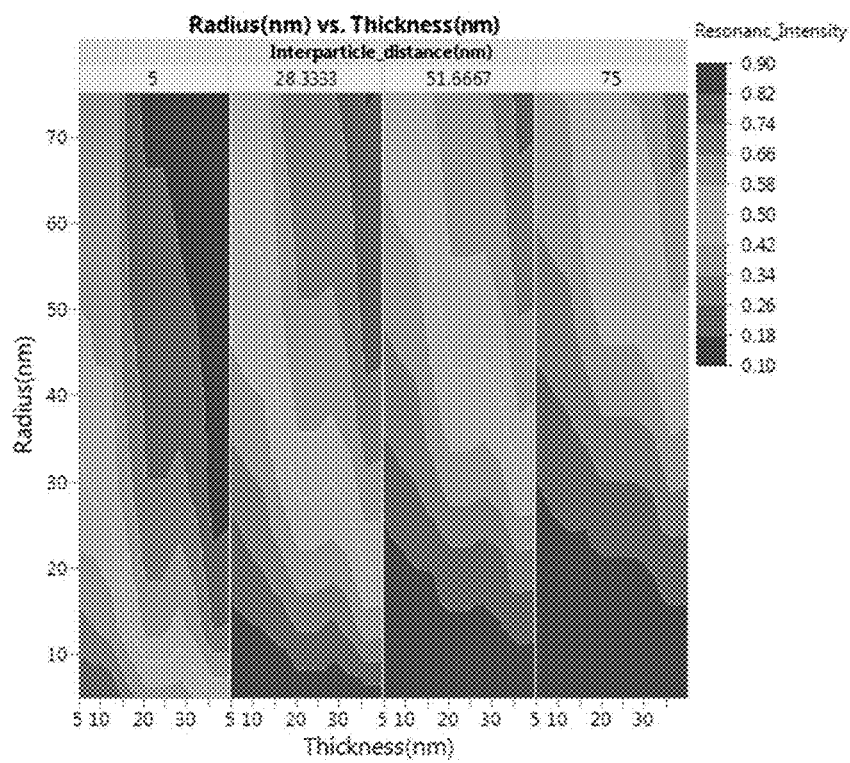
FIGS. 14a-14b show the resonance intensity and resonance wavelength for different radius, thickness, and interparticle distance combinations for columnar TiN metamaterial formations in a silicon oxide matrix.
Figure 14B:
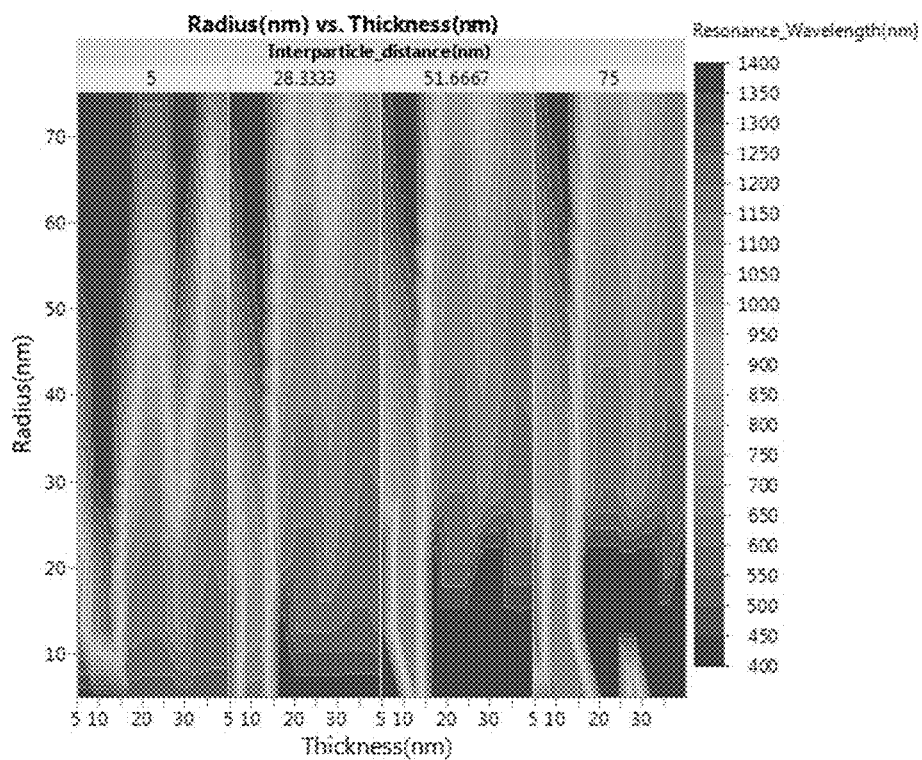

FIGS. 14a-14b show the resonance intensity and resonance wavelength for different radius, thickness, and interparticle distance combinations for columnar TiN metamaterial formations in a silicon oxide matrix. Here, the position of the resonances is similar to that of Ag and Au. However, the intensity of the resonance is considerably lower. The resonance is also broader. This suggests that TiN might not be as suitable as the above-described materials for low-E applications where there is a desire for high visible transmission, angular color independence, and high LSG, e.g., unless other modifications to a layer stack are made.

Figure 15:
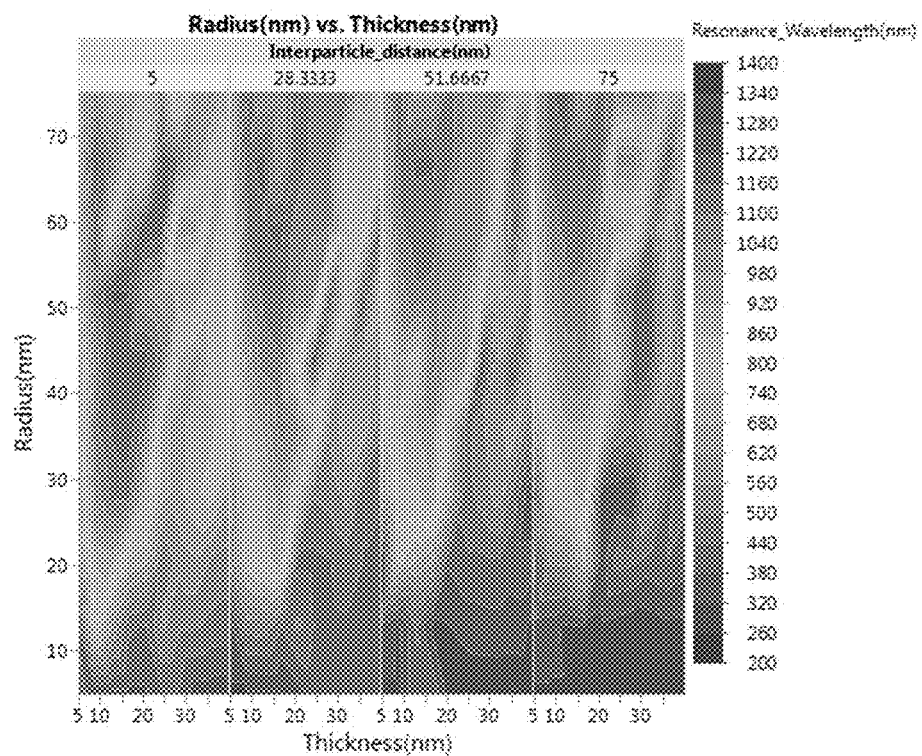
FIG. 15 shows the resonance wavelength for different radius, thickness, and interparticle distance combinations for ellipsoidal Ag metamaterial formations in a silicon oxide matrix.

FIG. 15 shows the resonance wavelength for different radius, thickness, and interparticle distance combinations for ellipsoidal Ag metamaterial formations in a silicon oxide matrix. In the FIG. 15 example, the radius corresponds to the radius along the major diameter, and the thickness corresponds to the entirety of the minor diameter. As will be appreciated from FIG. 15, there is a more progressive response when ellipsoids are used, as opposed to cylinders. This may be advantageous in certain example embodiments, as there is a broadening of resonance, e.g., instead of sharp changes as with cylinders. This could, in turn, open up broader processing windows, allow for more variation in radius, thickness, and/or interparticle distance parameters (which may be difficult to precisely control in some instances), etc.

It will be appreciated that the silicon oxide inclusive matrix may comprise or consist essentially of $SiO_2$ in certain example embodiments. In certain example embodiments, any silicon or niobium inclusive matrix may be used, and further details are provided below in this regard. As alluded to above, it will be appreciated that Ag, Cu, Al, AZO, Au, $RuO_2$, ITO, and/or other metamaterials may be used in certain example embodiments.

Semiconductor, transparent conductive oxide (TCO), and other materials may be used in different example embodiments. Thus, although certain example embodiments have been described in connection with Ag-inclusive metamaterial layers, it will be appreciated that other materials may be used in place of or together with Ag-based metal island layers. Other candidate materials that may be used in place of or together with Ag include so-called noble metals. In addition, materials such as Al, Au, AZO, Be, C, Cr, Cu, ITO, Ni, Pd, Pt, $RuO_2$, Ti, and/or W may be used in certain example embodiments.

Tests were performed to determine how metamaterial-inclusive layers could be self-assembled. In this regard, matrix materials were sputter deposited on a glass substrate above and below a sputter deposited layer of metal, and the intermediate article was heat treated. In a first set of experiments, self-assembled metamaterials were created by depositing a layer comprising Ag between two layers comprising NbOx deposited in the metallic state. The layer comprising Ag was deposited with a low line speed and high power, i.e., at a line speed of 8 m/min and at a power of 12 kW. The layers comprising NbOx were sputter deposited at 1.2 m/min. The coating was designed to have the same as-deposited thickness for the two layers comprising NbOx, namely, 30 nm thicknesses, and to have an 8 nm thickness for the layer comprising Ag. As shown in the FIG. 17*a* TEM images, however, the lower layer comprising NbOx, as deposited, was about 50 nm thick and the upper layer comprising NbOx, as deposited, was about 60 nm thick.

Figure 16:
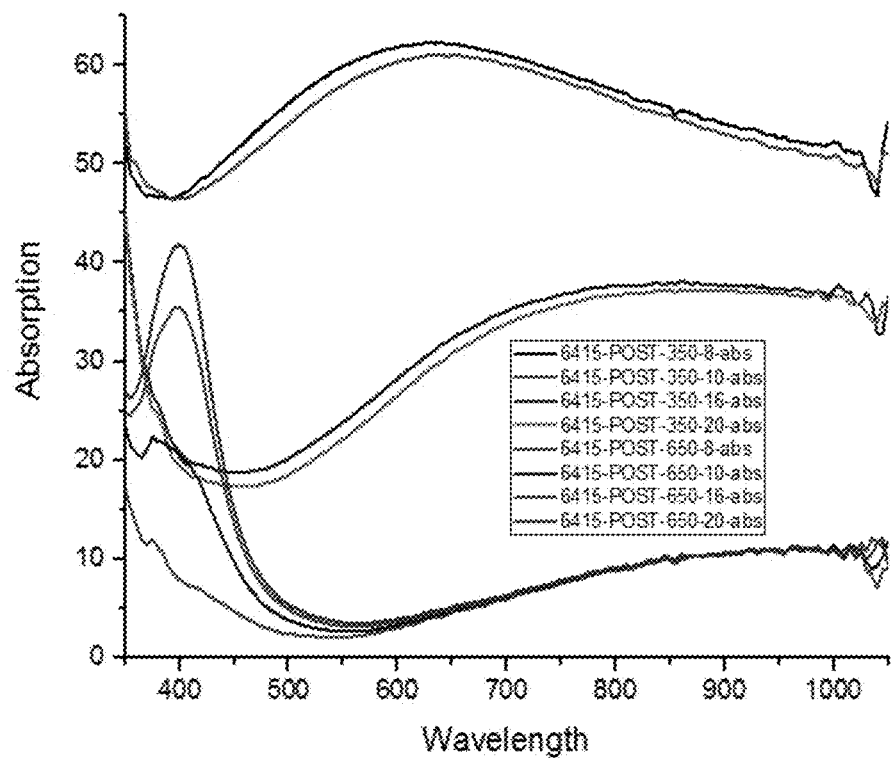
FIG. 16 is a graph showing the plasmon resonance observed in the calculated absorption from optical measurements for different heat treatment temperature and times for a first layer stack.

FIG. 16 is a graph showing the plasmon resonance observed in the calculated absorption from optical measurements for different heat treatment temperature and times for this first set of experiments. As can be seen from FIG. 16, samples heat treated at the higher temperature (650 degrees C.) show better performance than those samples heat treated at the lower temperature (350 degrees C.), and samples heat treated for longer periods of time show better performance than those samples heat treated for shorter periods of time. With respect to the samples heat treated 650 degrees C., the sample heat treated for 8 minutes shows the beginnings of resonance in the NIR wavelength range while absorption in the visible wavelength range remains low; the sample heat treated for 10 minutes shows the broadening of the resonance; the sample heat treated for 16 minutes produces a more defined resonance, and the sample heat treated for 20 minutes shows a further intensification of the resonance.

Figure 17A:
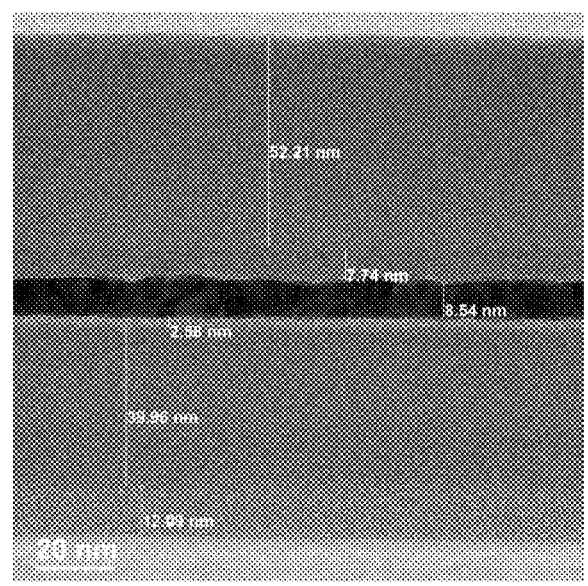
FIGS. 17a-17c are TEM images showing the evolution of a metamaterial-inclusive layer for the first layer stack, when heat treated at 650 degrees C.
Figure 17B:
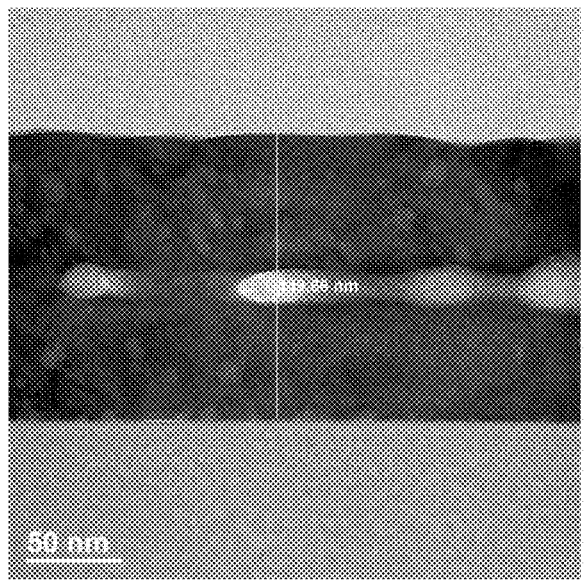
Figure 17C:
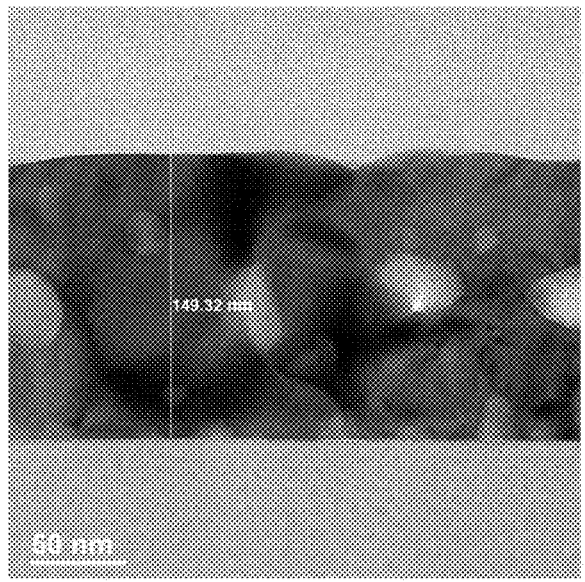

FIG. 17*a* is a TEM image showing the as-deposited layer stack, FIG. 17*b* is a TEM image showing the evolution of the layer stack after an 8 minute heat treatment at 650 degrees C., and FIG. 17*c* is a TEM image showing the further evolution of the layer stack after a 20 minute heat treatment at 650 degrees C. As can be seen from FIG. 17*c*, after this heat treatment regime and with this layer stack, the Ag coalesced and formed spheroidal-shaped particles that were self-assembled in the center layer of the stack. Some small, randomly-shaped particles also are visible. The self-assembly is believed to be facilitated by virtue of the mismatch in surface energy as between the major surfaces of the layer comprising Ag, the upper surface of the lower layer comprising NbOx, and the lower surface of the upper layer comprising NbOx.

In a second set of experiments, self-assembled metamaterials were created by depositing a layer comprising Ag between two layers comprising NbOx deposited in the metallic state, but the speed and power of the deposition were changed. That is, the layer comprising Ag was deposited with a high line speed and lower power, i.e., at a line speed of 10 m/min. The layers comprising NbOx again were sputter deposited at 1.2 m/min.

Figure 18:
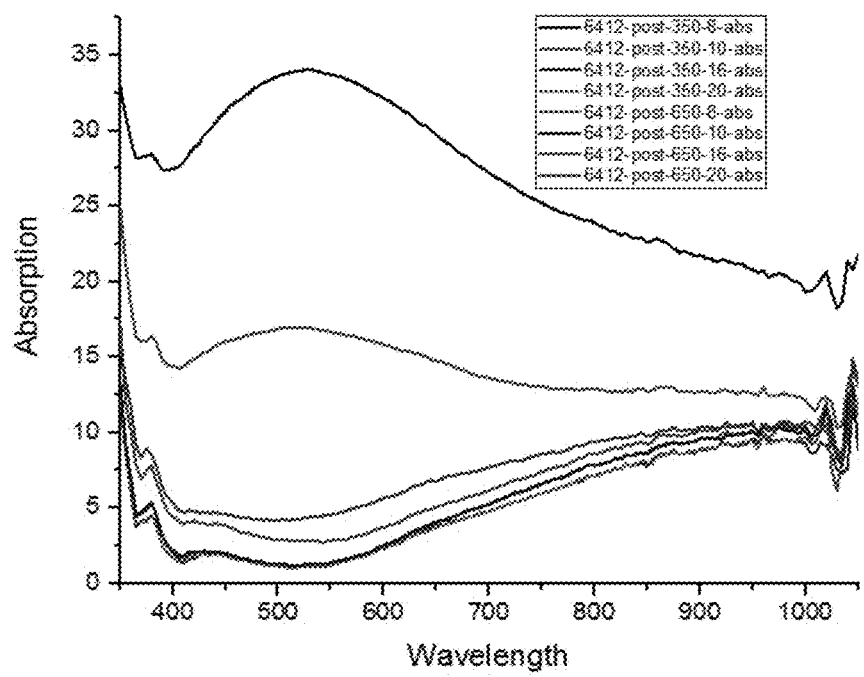
FIG. 18 is a graph showing the plasmon resonance observed in the calculated absorption from optical measurements for different heat treatment temperature and times for a second layer stack.

FIG. 18 is similar to FIG. 16, in that FIG. 18 is a graph showing the plasmon resonance observed in the calculated absorption from optical measurements for different heat treatment temperature and times for this second set of experiments. As above, samples in this set were heat treated at low and high temperatures (350 degrees C. and 650 degrees C., respectively), and for different lengths of time (namely, 8, 10, 16, and 20 minutes). However, as will be appreciated from FIG. 18, there is no real apparent resonance observed in any of the samples.

Figure 19A:
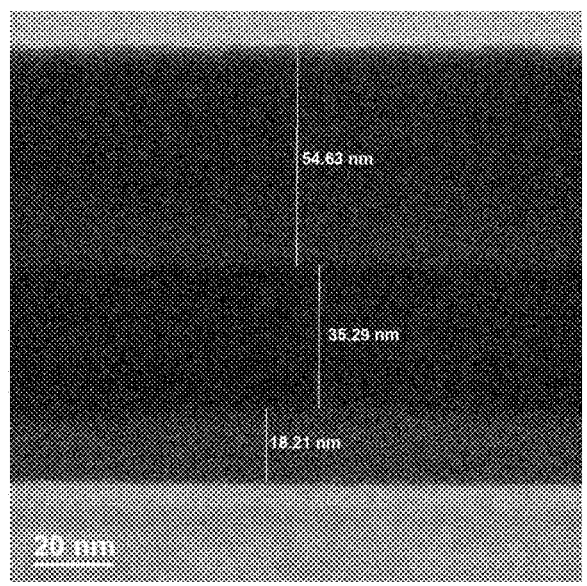
FIGS. 19a-19c are TEM images showing the evolution of a metamaterial-inclusive layer for the second layer stack, when heat treated at 650 degrees C.
Figure 19B:
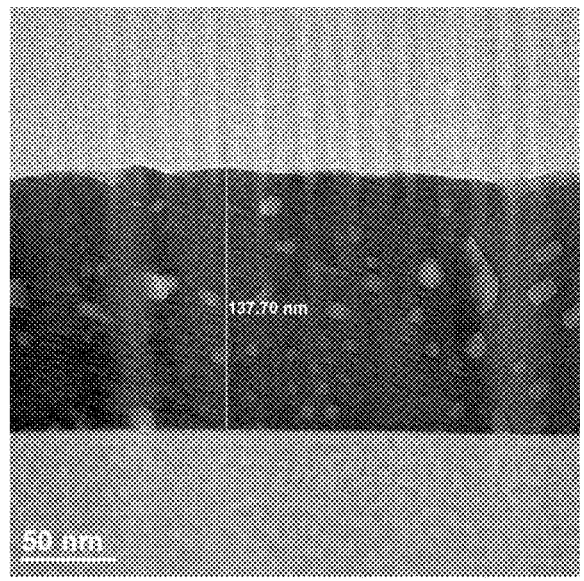
Figure 19C:
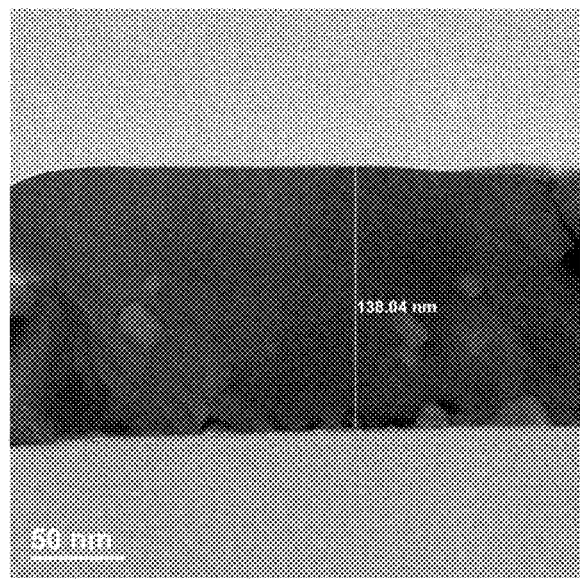

The lack of apparent resonance likely was because the particle size was too small in this set of samples. The TEM images in FIGS. 19*a*-19*c* seem to confirm this view. That is, FIG. 19*a* is a TEM image showing the as-deposited layer stack, FIG. 19*b* is a TEM image showing the evolution of the layer stack after an 8 minute heat treatment at 650 degrees C., and FIG. 19*c* is a TEM image showing the further evolution of the layer stack after a 20 minute heat treatment at 650 degrees C. As can be seen from FIGS. 19*a*-19*c*, after this heat treatment regime and with this layer stack, the samples exhibited small, randomly distributed particles. Whereas the first set of examples showed good densification, possibly enabled from the low line speed/high power deposition technique, the non-uniformities in the second set of samples resulted in "fluffy" as-deposited layers and led to the distribution of small particles throughout a big, thick layer. In the latter case, this hampered the development of the ultimate metamaterial-inclusive layer. In general, when it comes to silver deposition for this purpose, power levels in the 10-100 kW range, more preferably 10-75 kW range, and still more preferably 10-50 kW range, may be used in connection with certain example embodiments. Line speeds less than 20 m/min. are preferable when it comes to silver deposition for this purpose, with speeds less than 15 m/min. being preferred and speeds in the 5-15 m/min. being more preferred.

These results are interesting, as it was expected that there would be more adatom growth and that that would be a dominant growth regime. Surprisingly and unexpectedly, however, surface tensions seemed to have a significant influence on spherical agglomeration. Thus, in certain example embodiments, materials may be carefully selected so as to have surface tensions that work well with the silver or material used in the metamaterial creation. Oxides of Nb and/or Si have been found to be advantageous in this regard. It has been found that it is preferable to form the matrix holding the material by forming a first amount of matrix material, applying the silver or material used in the metamaterial creation, and applying a second amount of matrix material, and then subjecting this layer stack to heat treatment to trigger self-assembly of the metamaterial-inclusive layer. Preferably, the as-deposited thicknesses of the matrix material above and below application of the silver or material used in the metamaterial creation each are 10-300 nm and more preferably 10-100 nm, still more preferably 30-70 nm, with example thicknesses being in 30 nm, 50 nm, and 60 nm. Preferably, the as-deposited thicknesses of the matrix material before and after application of the silver or material used in the metamaterial creation are substantially equal. That is, the as-deposited thicknesses of the matrix material before and after application of the silver or material used in the metamaterial creation preferably differ from one another by no more than 20%, more preferably no more than 15%, and sometimes no more than 5-10%. The thickness of the silver or material used in the metamaterial creation may be from 1-20 nm, more preferably 1-15 nm, and still more preferably 5-10 nm, e.g., with an example of 8 nm. It will be appreciated that the latter of such thicknesses may be determined in connection with the interparticle spacing and diameters or major distance, e.g., as informed by the discussion above in connection with FIGS. 10a-15. In general, interparticle distances of 5-75 nm, diameters or major distances of 20-140 nm, and thicknesses of 5-50 nm or 10-50 nm may be used in different example embodiments.

Heating involved in the self-assembly may be performed at a temperature of 580-700 degrees C., more preferably 600-675 degrees C., and still more preferably 625-650 degrees C. The heating may be performed for 1-60 minutes, more preferably 10-30 minutes, and still more preferably 15-30 or 15-25 minutes, with an example time being at least 20 minutes.

It will be appreciated that the layers discussed herein may be formed in any suitable way. For example, a physical vapor deposition (PVD) technique such as sputtering or the like may be used to form the layers, as well as the metal or other islands that may be self-assembled into metamaterial inclusive layers in certain example embodiments. Metamaterials also may be formed via nano-imprinting, roll-to-roll transfers, evaporation on a micro-scale, etc.

Certain example embodiments may have metal island layers or formations useful in the metamaterial-inclusive layers discussed herein may be formed in accordance with the techniques of U.S. application Ser. No. 15/051,900 and/or U.S. application Ser. No. 15/051,927, each filed on Feb. 24, 2016, the entire contents of each of which is hereby incorporated by reference herein.

Furthermore, although certain example embodiments have been described as providing metamaterial-inclusive layers and/or layer stacks that provide substantially constant color as a function of angle, it will be appreciated that other optical and/or other behaviors may be provided in place of, or together with, substantially constant color vs. angle. For example, depending on the type of material selected, the size of the islands formed, etc., it may be possible to achieve desired color shifts (e.g., that are substantially constant across viewing angles) via large a* and/or b* changes; high conductivity or high resistivity; high reflection (e.g., for a mirror or mirror-like application); creation of colored transmission to simulate a tinted substrate (e.g., consistently across a wide range of viewing angles); creation of color or visual acuity enhancing effects such as might be used with sunglasses where particular visible ranges of wavelengths are selectively absorbed; etc.

The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments. These processes may be adapted to involve different times and/or temperatures, e.g., to work with the self-assembling approaches to metamaterial-inclusive layer formation described herein.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

In certain example embodiments, a coated article is provided. A substrate supports a multi-layer low-emissivity (low-E) coating. The multi-layer low-E coating comprises: a plurality of sub-stacks, with each said sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and a metamaterial-inclusive layer comprising Ag embedded in a matrix of material, with the metamaterial-inclusive layer being closer to the substrate than each of the sub-stacks, and with the Ag in the metamaterial-inclusive layer being discontinuous.

In addition to the features of the previous paragraph, in certain example embodiments, the multi-layer low-E coating may comprise three sub-stacks.

In addition to the features of either of the two previous paragraphs, in certain example embodiments, each barrier layer in each of the sub-stacks may comprise titanium, zirconium, and oxygen.

In addition to the features of any of the three previous paragraphs, in certain example embodiments, each upper contact layer in each of the sub-stacks may comprise Ni, Cr, and/or Ti, or an oxide thereof.

In addition to the features of any of the four previous paragraphs, in certain example embodiments, each upper contact layer in each of the sub-stacks may comprise NiTiNbO.

In addition to the features of any of the five previous paragraphs, in certain example embodiments, the metamaterial-inclusive layer may be sandwiched between and directly contacted by layers comprising TiZrOx.

In addition to the features of any of the six previous paragraphs, in certain example embodiments, an uppermost layer of the multi-layer low-E coating may comprise TiZrOx.

In addition to the features of any of the seven previous paragraphs, in certain example embodiments, the matrix of material may comprise Nb and/or Si.

In addition to the features of any of the eight previous paragraphs, in certain example embodiments, glass-side a* and b* values of the coated article each may vary by no more than 1.5 for angles ranging from 0-90 degrees from normal.

In addition to the features of any of the nine previous paragraphs, in certain example embodiments, glass-side a* and b* values of the coated article may be between 0 and −1 for substantially all angles ranging from 0-90 degrees from normal.

In addition to the features of any of the 10 previous paragraphs, in certain example embodiments, a light-to-solar gain (LSG) value may be 2-3 and a C value may be less than 2.

In addition to the features of any of the 11 previous paragraphs, in certain example embodiments, the Ag in the metamaterial-inclusive layer may be substantially spherical and/or substantially ellipsoidal, and distributed throughout the matrix material.

In certain example embodiments, a coated article is provided. A substrate supports a multi-layer low-emissivity (low-E) coating. The multi-layer low-E coating comprises: a plurality of sub-stacks, with each said sub-stack including, in order moving away from the substrate, a barrier layer comprising TiZrOx, a lower contact layer comprising zinc oxide, a continuous and uninterrupted layer comprising Ag over and directly contacting the layer comprising zinc oxide, and an upper contact layer over and directly contacting the layer comprising Ag; and a metamaterial-inclusive layer comprising Ag embedded in a matrix of material. The Ag in the metamaterial-inclusive layer is substantially spherical or ellipsoidal and distributed throughout the matrix material.

In addition to the features of the previous paragraph, in certain example embodiments, each upper contact layer in each of the sub-stacks may comprise Ni, Cr, and/or Ti, or an oxide thereof.

In addition to the features of either of the two previous paragraphs, in certain example embodiments, the metamaterial-inclusive layer may be sandwiched between and directly contacted by layers comprising TiZrOx.

In addition to the features of any of the three previous paragraphs, in certain example embodiments, an uppermost layer of the multi-layer low-E coating mya comprise TiZrOx.

In addition to the features of any of the four previous paragraphs, in certain example embodiments, a layer directly adjacent the substrate may comprise TiZrOx.

In addition to the features of any of the five previous paragraphs, in certain example embodiments, the Ag in the metamaterial-inclusive layer may exhibit surface plasmon effects, and the Ag in the continuous and uninterrupted layer comprising Ag may not exhibit surface plasmon effects.

In certain example embodiments, a coated article is provided. A substrate supports a multi-layer low-emissivity (low-E) coating. The multi-layer low-E coating comprises: at least one sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and a synthetic layer self-assembled by heat treatment, with the synthetic layer comprising discontinuous island-like formations of material embedded in a matrix, with the synthetic layer being closer to the substrate than the at least one sub-stack, and with each said island-like formation having a major distance of 10-300 nm.

In addition to the features of the previous paragraph, in certain example embodiments, the barrier layer in the at least one sub-stack may comprise Ti, Zr, and/or an oxide thereof.

In addition to the features of either of the two previous paragraphs, in certain example embodiments, an uppermost layer may comprise Ti, Zr, and/or an oxide thereof.

In addition to the features of any of the three previous paragraphs, in certain example embodiments, the synthetic layer may be sandwiched between and directly contacted by layers comprising TiZrOx.

In addition to the features of the previous paragraph, in certain example embodiments, the layer comprising TiZrOx above the synthetic layer may be the barrier layer in the at least one sub-stack.

In addition to the features of either of the two previous paragraphs, in certain example embodiments, the layer comprising TiZrOx below the metamaterial-inclusive layer may be directly on and in contact with the substrate.

In addition to the features of any of the six previous paragraphs, in certain example embodiments, the upper contact layer in the at least one sub-stack may comprise Ni and Ti.

In certain example embodiments, a method of making a coated article including a multi-layer low-E coating supported by a glass substrate is provided. The method comprises: forming a plurality of sub-stacks on the substrate, with each said sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and forming a metamaterial-inclusive layer comprising Ag embedded in a matrix of material, with the metamaterial-inclusive layer being closer to the substrate than each of the sub-stacks, and with the Ag in the metamaterial-inclusive layer being discontinuous.

In addition to the features of the previous paragraph, in certain example embodiments, each barrier layer in each of the sub-stacks may comprise titanium, zirconium, and oxygen.

In addition to the features of either of the two previous paragraphs, in certain example embodiments, each upper contact layer in each of the sub-stacks may comprise Ni, Cr, and/or Ti, or an oxide thereof.

In addition to the features of any of the three previous paragraphs, in certain example embodiments, each upper contact layer in each of the sub-stacks may comprise NiTiNbO.

In addition to the features of any of the four previous paragraphs, in certain example embodiments, glass-side a* and b* values of the coated article each may vary by no more than 1.5 for angles ranging from 0-90 degrees from normal.

In addition to the features of any of the five previous paragraphs, in certain example embodiments, glass-side a* and b* values of the coated article may be between 0 and −1 for substantially all angles ranging from 0-90 degrees from normal.

In addition to the features of any of the six previous paragraphs, in certain example embodiments, a light-to-solar gain (LSG) value may be 2-3 and a C value may be less than 2.

In certain example embodiments, a method of making a coated article including a multi-layer low-E coating supported by a glass substrate is provided. The method comprises: forming a plurality of sub-stacks on the substrate, with each said sub-stack including, in order moving away from the substrate, a barrier layer comprising an oxide of Ti and/or Zr, a lower contact layer comprising zinc oxide, a continuous and uninterrupted layer comprising Ag over and directly contacting the layer comprising zinc oxide, and an upper contact layer over and directly contacting the layer comprising Ag; and causing a synthetic layer to self-assemble via heat treatment, with the synthetic layer, once self-assembled, comprising discontinuous island-like formations of material including Ag embedded in a matrix. The Ag in the synthetic layer is substantially spherical or ellipsoidal and distributed throughout the matrix.

In addition to the features of the previous paragraph, in certain example embodiments, the synthetic layer may be sandwiched between and directly contacted by layers comprising an oxide of Ti and/or Zr.

In addition to the features of either of the two previous paragraphs, in certain example embodiments, an uppermost layer of the multi-layer low-E coating may comprise an oxide of Ti and/or Zr.

In addition to the features of any of the three previous paragraphs, in certain example embodiments, the Ag in synthetic layer may exhibit surface plasmon effects, and the Ag in the continuous and uninterrupted layer comprising Ag may not exhibit surface plasmon effects.

In certain example embodiments, a method of making a coated article including a multi-layer low-E coating supported by a glass substrate is provided. The method comprises: forming at least one sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and forming a metamaterial-inclusive layer comprising Ag embedded in a matrix of material, with the metamaterial-inclusive layer being closer to the substrate than the at least one sub-stack, and with the Ag in the metamaterial-inclusive layer being discontinuous.

In addition to the features of the previous paragraph, in certain example embodiments, the barrier layer in the at least one sub-stack may comprise TiZrOx.

In addition to the features of either of the two previous paragraphs, in certain example embodiments, an uppermost layer may comprise TiZrOx.

In addition to the features of any of the three previous paragraphs, in certain example embodiments, the metamaterial-inclusive layer may be sandwiched between and directly contacted by layers comprising TiZrOx.

In addition to the features of the previous paragraph, in certain example embodiments, the layer comprising TiZrOx above the metamaterial-inclusive layer may be the barrier layer in the at least one sub-stack.

In addition to the features of either of the two previous paragraphs, in certain example embodiments, the layer comprising TiZrOx below the metamaterial-inclusive layer may be directly on and in contact with the substrate.

In addition to the features of any of the six previous paragraphs, in certain example embodiments, the upper contact layer in the at least one sub-stack may comprise Ni and Ti.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A coated article, comprising:
a substrate supporting a multi-layer low-emissivity (low-E) coating;
wherein the multi-layer low-E coating comprises:
a plurality of sub-stacks, each said sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and
a metamaterial-inclusive layer comprising Ag embedded in a matrix of material, the metamaterial-inclusive layer being closer to the substrate than each of the sub-stacks, the Ag in the metamaterial-inclusive layer being discontinuous.

2. The coated article of claim 1, wherein the multi-layer low-E coating comprises three sub-stacks.

3. The coated article of claim 1, wherein each barrier layer in each of the sub-stacks comprises titanium, zirconium, and oxygen.

4. The coated article of claim 3, wherein each upper contact layer in each of the sub-stacks comprises Ni, Cr, and/or Ti, or an oxide thereof.

5. The coated article of claim 4, wherein each upper contact layer in each of the sub-stacks comprises NiTiNbO.

6. The coated article of claim 1, wherein each upper contact layer in each of the sub-stacks comprises NiTiNbO.

7. The coated article of claim 1, wherein the metamaterial-inclusive layer is sandwiched between and directly contacted by layers comprising TiZrOx.

8. The coated article of claim 7, wherein an uppermost layer of the multi-layer low-E coating comprises TiZrOx.

9. The coated article of claim 1, wherein the matrix of material comprises Nb.

10. The coated article of claim 1, wherein the matrix of material comprises Si.

11. The coated article of claim 1, wherein glass-side a* and b* values of the coated article each vary by no more than 1.5 for angles ranging from 0-90 degrees from normal.

12. The coated article of claim 11, wherein glass-side a* and b* values of the coated article are between 0 and −1 for substantially all angles ranging from 0-90 degrees from normal.

13. The coated article of claim 11, having a light-to-solar gain (LSG) value of 2-3 and a C value of less than 2.

14. The coated article of claim 1, wherein glass-side a* and b* values of the coated article are between 0 and −1 for substantially all angles ranging from 0-90 degrees from normal.

15. The coated article of claim 1, having a light-to-solar gain (LSG) value of 2-3 and a C value of less than 2.

16. The coated article of claim 1, wherein the Ag in the metamaterial-inclusive layer is substantially spherical and distributed throughout the matrix material.

17. The coated article of claim 1, wherein the Ag in the metamaterial-inclusive layer is substantially ellipsoidal and distributed throughout the matrix material.

18. A coated article, comprising:
a substrate supporting a multi-layer low-emissivity (low-E) coating;
wherein the multi-layer low-E coating comprises:
a plurality of sub-stacks, each said sub-stack including, in order moving away from the substrate, a barrier layer comprising TiZrOx, a lower contact layer comprising zinc oxide, a continuous and uninterrupted layer comprising Ag over and directly contacting the layer comprising zinc oxide, and an upper contact layer over and directly contacting the layer comprising Ag; and
a metamaterial-inclusive layer comprising Ag embedded in a matrix of material, wherein the Ag in the metamaterial-inclusive layer is substantially spherical or ellipsoidal and distributed throughout the matrix material.

19. The coated article of claim 18, wherein each upper contact layer in each of the sub-stacks comprises Ni, Cr, and/or Ti, or an oxide thereof.

20. The coated article of claim 18, wherein the metamaterial-inclusive layer is sandwiched between and directly contacted by layers comprising TiZrOx.

21. The coated article of claim 1, wherein an uppermost layer of the multi-layer low-E coating comprises TiZrOx.

22. The coated article of claim 21, wherein a layer directly adjacent the substrate comprises TiZrOx.

23. The coated article of claim 18, wherein the Ag in the metamaterial-inclusive layer exhibits surface plasmon effects, and wherein the Ag in the continuous and uninterrupted layer comprising Ag does not exhibit surface plasmon effects.

24. A coated article, comprising:
a substrate supporting a multi-layer low-emissivity (low-E) coating;
wherein the multi-layer low-E coating comprises:
at least one sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and
a synthetic layer self-assembled by heat treatment, the synthetic layer comprising discontinuous island-like formations of material embedded in a matrix, the synthetic layer being closer to the substrate than the at least one sub-stack, each said island-like formation having a major distance of 10-300 nm.

25. The coated article of claim 24, wherein the barrier layer in the at least one sub-stack comprises Ti, Zr, and/or an oxide thereof.

26. The coated article of claim 24, further comprising an uppermost layer comprising Ti, Zr, and/or an oxide thereof.

27. The coated article of claim 25, wherein the synthetic layer is sandwiched between and directly contacted by layers comprising TiZrOx.

28. The coated article of claim 27, wherein the layer comprising TiZrOx above the synthetic layer is the barrier layer in the at least one sub-stack.

29. The coated article of claim 28, wherein the layer comprising TiZrOx below the metamaterial-inclusive layer is directly on and in contact with the substrate.

30. The coated article of claim 24, wherein the upper contact layer in the at least one sub-stack comprises Ni and Ti.

31. A method of making a coated article including a multi-layer low-E coating supported by a glass substrate, the method comprising:
forming a plurality of sub-stacks on the substrate, each said sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and
forming a metamaterial-inclusive layer comprising Ag embedded in a matrix of material, the metamaterial-inclusive layer being closer to the substrate than each of the sub-stacks, the Ag in the metamaterial-inclusive layer being discontinuous.

32. The method of claim 31, wherein each barrier layer in each of the sub-stacks comprises titanium, zirconium, and oxygen.

33. The method of claim 31, wherein each upper contact layer in each of the sub-stacks comprises Ni, Cr, and/or Ti, or an oxide thereof.

34. The method of claim 31, wherein each upper contact layer in each of the sub-stacks comprises NiTiNbO.

35. The method of claim 31, wherein glass-side a* and b* values of the coated article each vary by no more than 1.5 for angles ranging from 0-90 degrees from normal.

36. The method of claim 35, wherein glass-side a* and b* values of the coated article are between 0 and −1 for substantially all angles ranging from 0-90 degrees from normal.

37. The method of claim 36, having a light-to-solar gain (LSG) value of 2-3 and a C value of less than 2.

38. The method of claim 31, having a light-to-solar gain (LSG) value of 2-3 and a C value of less than 2.

39. A method of making a coated article including a multi-layer low-E coating supported by a glass substrate, the method comprising:
forming a plurality of sub-stacks on the substrate, each said sub-stack including, in order moving away from the substrate, a barrier layer comprising an oxide of Ti and/or Zr, a lower contact layer comprising zinc oxide, a continuous and uninterrupted layer comprising Ag over and directly contacting the layer comprising zinc oxide, and an upper contact layer over and directly contacting the layer comprising Ag; and
causing a synthetic layer to self-assemble via heat treatment, the synthetic layer, once self-assembled, comprising discontinuous island-like formations of material including Ag embedded in a matrix, wherein the Ag in the synthetic layer is substantially spherical or ellipsoidal and distributed throughout the matrix.

40. The method of claim 39, wherein the synthetic layer is sandwiched between and directly contacted by layers comprising an oxide of Ti and/or Zr.

41. The method of claim 39, wherein an uppermost layer of the multi-layer low-E coating comprises an oxide of Ti and/or Zr.

42. The method of claim 39, wherein the Ag in synthetic layer exhibits surface plasmon effects, and wherein the Ag in the continuous and uninterrupted layer comprising Ag does not exhibit surface plasmon effects.

43. A method of making a coated article including a multi-layer low-E coating supported by a glass substrate, the method comprising:
forming at least one sub-stack including, in order moving away from the substrate, a barrier layer, a lower contact layer comprising zinc oxide, a continuous and uninterrupted layer comprising Ag over and directly contacting the layer comprising zinc oxide, and an upper contact layer over and directly contacting the layer comprising Ag; and
forming a metamaterial-inclusive layer comprising Ag embedded in a matrix of material, the metamaterial-inclusive layer being closer to the substrate than the at least one sub-stack, the Ag in the metamaterial-inclusive layer being discontinuous.

44. The method of claim 43, wherein the barrier layer in the at least one sub-stack comprises TiZrOx.

45. The coated article of claim 43, further comprising an uppermost layer comprising TiZrOx.

46. The coated article of claim 43, wherein the metamaterial-inclusive layer is sandwiched between and directly contacted by layers comprising TiZrOx.

47. The coated article of claim 46, wherein the layer comprising TiZrOx above the metamaterial-inclusive layer is the barrier layer in the at least one sub-stack.

48. The coated article of claim 47, wherein the layer comprising TiZrOx below the metamaterial-inclusive layer is directly on and in contact with the substrate.

49. The coated article of claim 43, wherein the upper contact layer in the at least one sub-stack comprises Ni and Ti.

* * * * *